(12) United States Patent
Ohuchida et al.

(10) Patent No.: US 11,798,793 B2
(45) Date of Patent: Oct. 24, 2023

(54) SUBSTRATE PROCESSING METHOD, COMPONENT PROCESSING METHOD, AND SUBSTRATE PROCESSING APPARATUS

(71) Applicant: Tokyo Electron Limited, Tokyo (JP)

(72) Inventors: Satoshi Ohuchida, Miyagi (JP); Koki Mukaiyama, Miyagi (JP); Yusuke Wako, Miyagi (JP); Maju Tomura, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/583,224

(22) Filed: Jan. 25, 2022

(65) Prior Publication Data

US 2022/0238315 A1  Jul. 28, 2022

(30) Foreign Application Priority Data

Jan. 26, 2021 (JP) ................................ 2021-010187
May 6, 2021 (JP) ................................ 2021-078608

(51) Int. Cl.
*H01J 37/32* (2006.01)
*H01L 21/02* (2006.01)
(Continued)

(52) U.S. Cl.
CPC .......... *H01J 37/32724* (2013.01); *B08B 3/08* (2013.01); *B08B 5/00* (2013.01);
(Continued)

(58) Field of Classification Search
CPC . H01J 37/32724; H01J 2237/334; B08B 3/08; B08B 5/00; B08B 13/00;
(Continued)

(56) References Cited

U.S. PATENT DOCUMENTS

| | | | |
|---|---|---|---|
| 2003/0146428 A1* | 8/2003 | Ma .................... | H01L 29/66916 257/19 |
| 2008/0142988 A1* | 6/2008 | Hyland ............. | H01L 21/76814 257/E21.241 |
| 2014/0083979 A1* | 3/2014 | Tahara .............. | H01L 21/31116 216/67 |

FOREIGN PATENT DOCUMENTS

| | | | | |
|---|---|---|---|---|
| JP | H11354516 A | * 12/1999 | ....... | H01L 21/02164 |
| JP | 2003-188139 A | 7/2003 | | |

(Continued)

*Primary Examiner* — Duy Vu N Deo
(74) *Attorney, Agent, or Firm* — XSENSUS LLP

(57) ABSTRACT

A substrate processing method includes: (a) disposing a substrate on a substrate support provided in a chamber of a substrate processing apparatus; (b) supplying a processing gas including hydrogen fluoride gas into the chamber; (c) controlling a temperature of the substrate support to a first temperature, and a pressure of the hydrogen fluoride gas in the chamber to a first pressure; and (d) controlling the temperature of the substrate support to a second temperature, and the pressure of the hydrogen fluoride gas in the chamber to a second pressure. In a graph with a horizontal axis indicating a temperature and a vertical axis indicating a pressure, the first temperature and the first pressure are positioned in a first region above an adsorption equilibrium pressure curve of hydrogen fluoride, and the second temperature and the second pressure are positioned in a second region below the adsorption equilibrium pressure curve.

17 Claims, 24 Drawing Sheets

(51) Int. Cl.
*H01L 21/311* (2006.01)
*B08B 5/00* (2006.01)
*B08B 13/00* (2006.01)
*B08B 3/08* (2006.01)

(52) U.S. Cl.
CPC .......... *B08B 13/00* (2013.01); *H01L 21/0206* (2013.01); *H01L 21/31138* (2013.01); *H01L 21/31144* (2013.01); *H01J 2237/334* (2013.01)

(58) Field of Classification Search
CPC ........... H01L 21/0206; H01L 21/31138; H01L 21/31144; H01L 21/02063; H01L 21/31122; H01L 21/67109; H01L 21/67248; H01L 21/30604; H01L 21/3065; H01L 21/67069; H01L 21/67075; H01L 21/67028
USPC .................................................. 438/694–714
See application file for complete search history.

(56) References Cited

FOREIGN PATENT DOCUMENTS

| | | | | |
|---|---|---|---|---|
| KR | 970003888 B1 | * | 3/1997 | ........ H01L 21/31116 |
| KR | 101895095 B1 | * | 9/2018 | ........ H01L 21/31116 |

* cited by examiner

SUBSTRATE PROCESSING METHOD, COMPONENT PROCESSING METHOD, AND SUBSTRATE PROCESSING APPARATUS

CROSS-REFERENCE TO RELATED APPLICATIONS

This application is based on and claims priority from Japanese Patent Application Nos. 2021-010187 and 2021-078608, filed on Jan. 26, 2021, and May 6, 2021, respectively, with the Japan Patent Office, the disclosures of which are incorporated herein in their entireties by reference.

TECHNICAL FIELD

The present disclosure relates to a substrate processing method, a component processing method, and a substrate processing apparatus.

BACKGROUND

Japanese Patent Laid-Open Publication No. 2003-188139 discloses a method of removing etching residues adhering to a semiconductor substrate by using a fluorine-containing peeling solution.

SUMMARY

An embodiment of the present disclosure provides a substrate processing method including: (a) disposing a substrate on a substrate support in a chamber of a substrate processing apparatus; (b) supplying a processing gas including hydrogen fluoride gas into the chamber; (c) controlling a temperature of the substrate support to a first temperature, and a pressure of the hydrogen fluoride gas in the chamber to a first pressure; and (d) controlling the temperature of the substrate support to a second temperature, and the pressure of the hydrogen fluoride gas in the chamber to a second pressure. In a graph with a horizontal axis indicating a temperature and a vertical axis indicating a pressure, the first temperature and the first pressure are positioned in a first region above an adsorption equilibrium pressure curve of hydrogen fluoride, and the second temperature and the second pressure are positioned in a second region below the adsorption equilibrium pressure curve.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
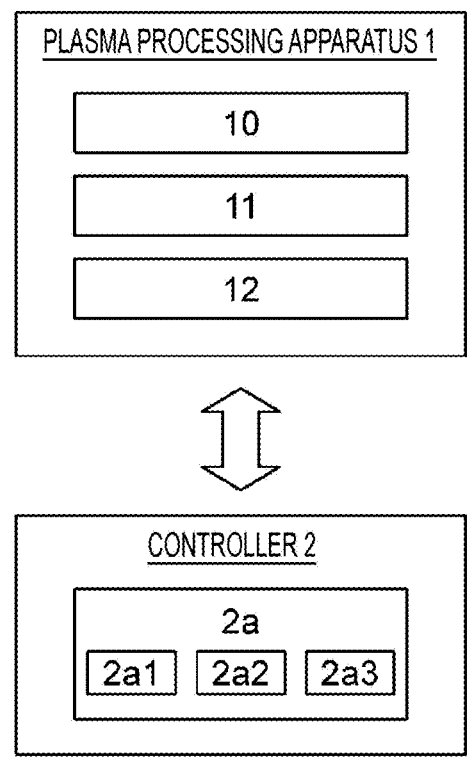
FIG. 1 is a view schematically illustrating a substrate processing apparatus according to an embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described.

An embodiment of the present disclosure provides a substrate processing method for processing a substrate on a substrate support disposed in a chamber of a substrate processing apparatus. The method includes (a) supplying a processing gas including hydrogen fluoride gas into the chamber; (b) controlling a temperature of the substrate support to a first temperature, and a pressure of the hydrogen fluoride gas in the chamber to a first pressure; and (c) controlling the temperature of the substrate support to a second temperature, and the pressure of the hydrogen fluoride gas in the chamber to a second pressure. In a graph with a horizontal axis indicating a temperature and a vertical axis indicating a pressure, the first temperature and the first pressure are positioned in a first region above an adsorption equilibrium pressure curve of hydrogen fluoride, and the second temperature and the second pressure are positioned in a second region below the adsorption equilibrium pressure curve.

According to the method of the embodiment above, when a substance (e.g., an etching residue or particles) exists on the surface of the substrate, the substance may be removed with the desorption of hydrogen fluoride.

In the graph above, the first region may be present below a saturated vapor pressure curve of hydrogen fluoride. The first temperature and the second temperature may be in the range of −140° C. or higher and 0° C. or lower, and the first pressure and the second pressure may be in the range of 1 Pa or more and $1\times10^5$ Pa or less.

The substrate may include a silicon-containing film. In this case, the substance produced from the silicon-containing film may be removed with the desorption of hydrogen fluoride.

The substrate may include a metal-containing film. In this case, the substance produced from the metal-containing film may be removed with the desorption of hydrogen fluoride.

In (b) above, a substance produced from the substrate processing apparatus may adhere to the surface of the substrate. In this case, the substance produced from the substrate processing apparatus may be removed with the desorption of hydrogen fluoride.

The processing gas may include an inert gas. In this case, the amount of the substance to be removed may be adjusted by adjusting a flow rate ratio of the inert gas.

Another embodiment of the present disclosure provides a method of processing a component disposed in a chamber of a substrate processing apparatus. The method includes: (a) supplying a processing gas including hydrogen fluoride gas into the chamber; (b) controlling a temperature of the component to a first temperature, and a pressure of the hydrogen fluoride gas in the chamber to a first pressure; and (c) controlling the temperature of the component to a second temperature, and the pressure of the hydrogen fluoride gas in the chamber to a second pressure. In a graph with a horizontal axis indicating a temperature and a vertical axis indicating a pressure, the first temperature and the first pressure are positioned in a first region above an adsorption equilibrium pressure curve of hydrogen fluoride, and the second temperature and the second pressure are positioned in a second region below the adsorption equilibrium pressure curve.

According to the method of the embodiment above, when a substance (e.g., an etching residue or particles) exists on the surface of the component, the substance may be removed with the desorption of hydrogen fluoride.

Yet another embodiment of the present disclosure provides a substrate processing apparatus. The substrate processing apparatus includes: a chamber; a substrate support configured to support a substrate in the chamber; a gas supply configured to supply a processing gas including hydrogen fluoride gas into the chamber; and a controller. The controller is configured to control a temperature of the substrate support to a first temperature, and a pressure of the hydrogen fluoride gas in the chamber to a first pressure; and control the temperature of the substrate support to a second temperature, and the pressure of the hydrogen fluoride gas in the chamber to a second pressure. In a graph with a horizontal axis indicating a temperature and a vertical axis indicating a pressure, the first temperature and the first pressure are positioned in a first region above an adsorption equilibrium pressure curve of hydrogen fluoride, and the second temperature and the second pressure are positioned in a second region below the adsorption equilibrium pressure curve.

According to the substrate processing apparatus of the embodiment above, when a substance (e.g., an etching residue or particles) exists on the surface of the substrate, the substance may be removed with the desorption of hydrogen fluoride.

Yet another embodiment of the present disclosure provides a substrate processing method. The method includes: (a) providing a substrate including a base film and a mask provided on the base film, the mask having an opening therein; (b) etching the base film using plasma; and (c) supplying hydrogen fluoride to the mask, thereby removing a deposit adhering to the opening of the mask in (b).

According to the method of the embodiment above, the deposit may be removed by hydrogen fluoride in (c).

In (c) above, hydrogen fluoride gas may be supplied without generating plasma. In this case, the etching of the mask by plasma is suppressed.

In (c) above, hydrofluoric acid may be supplied. In this case, the deposit may be removed by hydrofluoric acid.

The method above may further include (d) etching the base film using plasma, after (c). In this case, the deposit is removed in (c). Thus, a recess having a desired shape may be formed on the base film through the etching performed after (c).

The method above may further include (e) supplying hydrogen fluoride to the mask, thereby removing the deposit adhering to the opening of the mask in (d). In this case, the deposit may be removed by hydrogen fluoride in (e).

The mask may contain silicon.

The base film may contain carbon.

Yet another embodiment of the present disclosure provides a substrate processing apparatus. The substrate processing apparatus includes: a chamber; a substrate support configured to support a substrate in the chamber, the substrate including a base film and a mask provided on the base film, the mask having an opening therein; a gas supply configured to supply each of a first processing gas and a second processing gas into the chamber, the second processing gas including hydrogen fluoride gas; a plasma generator configured to generate plasma from the first processing gas in the chamber; and a controller. The controller is configured to control the gas supply and the plasma generator to etch the base film using the plasma, and control the gas supply to supply the second processing gas to the mask, thereby removing a deposit adhering to the opening of the mask when the base film is etched.

According to the substrate processing apparatus of the embodiment above, the deposit may be removed by the second processing gas including hydrogen fluoride gas.

Yet another embodiment of the present disclosure provides a substrate processing apparatus. The substrate processing apparatus includes: a chamber; a substrate support configured to support a substrate in the chamber, the substrate including a base film and a mask provided on the base film, the mask having an opening therein; a gas supply configured to supply a first processing gas into the chamber; a plasma generator configured to generate plasma from the first processing gas in the chamber; a wet processing apparatus including a container for accommodating hydrofluoric acid; and a controller. The controller is configured to control the gas supply and the plasma generator to etch the base film using the plasma, and control the wet processing apparatus to supply the hydrofluoric acid to the mask, thereby removing a deposit adhering to the opening of the mask when the base film is etched.

According to the substrate processing apparatus of the embodiment above, the deposit may be removed by hydrofluoric acid.

Hereinafter, various embodiments will be described in detail with reference to the drawings. In the respective drawings, similar or corresponding portions will be denoted by the same reference numerals.

Figure 2:
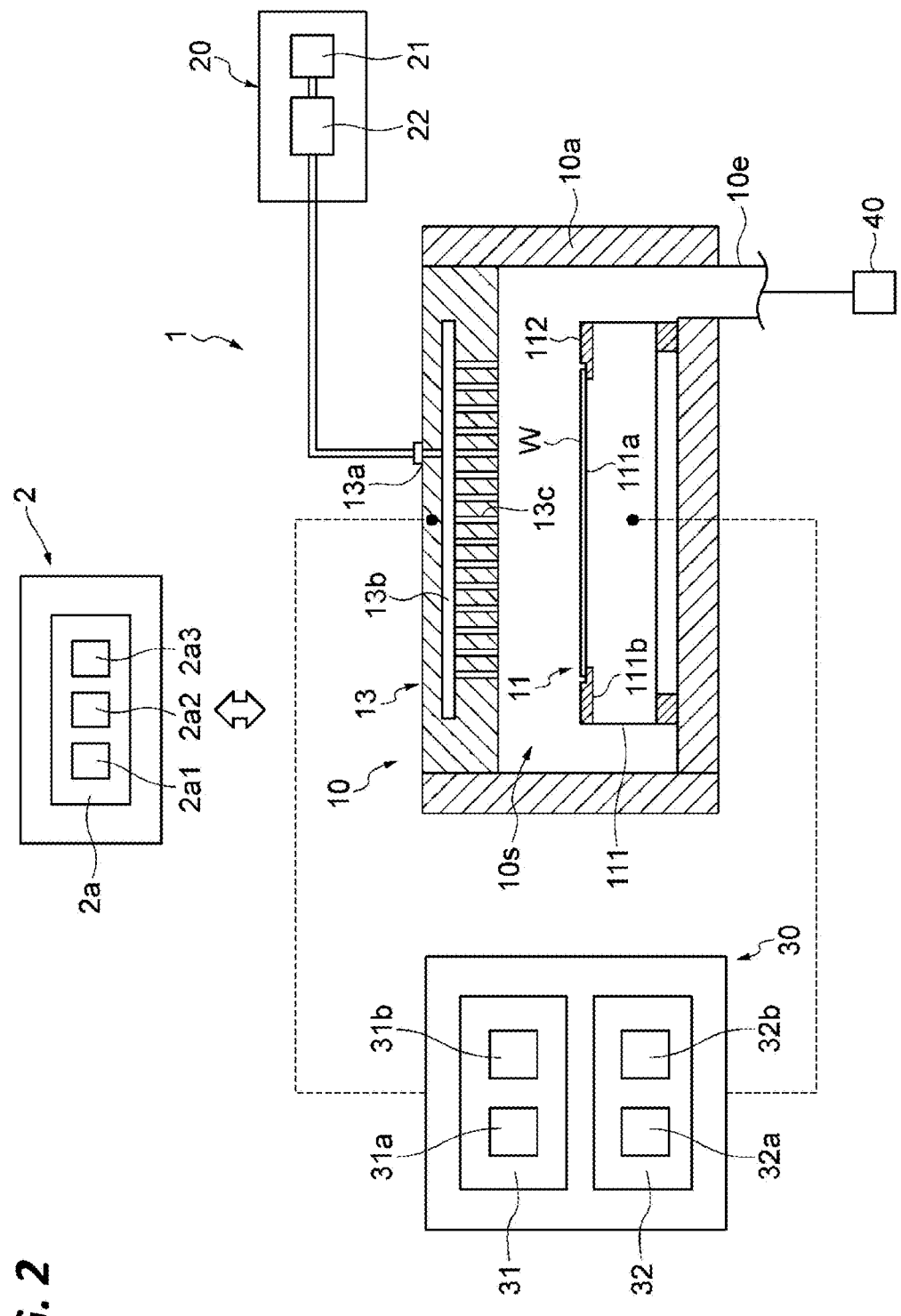
FIG. 2 is a view schematically illustrating a plasma processing apparatus according to an embodiment.

FIGS. 1 and 2 are views schematically illustrating a substrate processing apparatus according to an embodiment. A substrate processing apparatus of the present embodiment is, for example, a plasma processing system.

In an embodiment, the plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. Further, the plasma processing chamber 10 includes at least one gas supply port for supplying at least one processing gas into the plasma processing space, and at least one gas exhaust port for exhausting a gas from the plasma processing space. The gas supply port is connected to a gas supply 20 to be described later, and the gas exhaust port is connected to an exhaust system 40 to be described later. The substrate support 11 is disposed in the plasma processing space, and has a substrate support surface for supporting a substrate.

The plasma generator 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave excited plasma (HWP), or surface wave plasma (SWP). Various types of plasma generators, including an alternating current (AC) plasma generator and a direct current (DC) plasma generator, may be used. In an embodiment, an AC signal (AC power) used in the AC plasma generator has a frequency in the range of 100 kHz to 10 GHz. Accordingly, the AC signal includes a radio frequency (RF) signal and a microwave signal. In an embodiment, the RF signal has a frequency in the range of 200 kHz to 150 MHz.

The controller 2 processes computer-executable commands for causing the plasma processing apparatus 1 to execute various steps to be described therein. The controller 2 may be configured to control each unit of the plasma processing apparatus 1 to execute the various steps to be described herein. In an embodiment, a portion of the controller 2 or the entire controller 2 may be included in the plasma processing apparatus 1. The controller 2 may include, for example, a computer 2a. The computer 2a may include, for example, a processor (central processing unit; CPU) 2a1, a storage unit 2a2, and a communication interface 2a3. The processor 2a1 may be configured to perform various control operations based on programs stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN).

Hereinafter, an example of the configuration of the plasma processing system will be described.

The plasma processing system includes the capacitively coupled plasma processing apparatus 1 and the controller 2. The capacitively coupled plasma processing apparatus 1 includes the plasma processing chamber 10, the gas supply 20, a power supply 30, and the exhaust system 40. Further, the plasma processing apparatus 1 includes the substrate support 11 and a gas introduction unit. The gas introduction unit is configured to introduce at least one processing gas into the plasma processing chamber 10. The gas introduction unit includes a shower head 13. The substrate support 11 is disposed inside the plasma processing chamber 10. The shower head 13 is disposed above the substrate support 11. In an embodiment, the shower head 13 makes up at least a portion of the ceiling of the plasma processing chamber 10. The plasma processing chamber 10 has the plasma processing space 10s defined by the shower head 13, the side wall 10a of the plasma processing chamber 10, and the substrate support 11. The plasma processing chamber 10 includes at least one gas supply port for supplying at least one processing gas into the plasma processing space 10s, and at least one gas exhaust port for exhausting a gas from the plasma processing space. The side wall 10a is grounded. The shower head 13 and the substrate support 11 are electrically insulated from the housing of the plasma processing chamber 10.

The substrate support 11 includes a main body 111 and a ring assembly 112. The main body 111 has a central region (substrate support surface) 111a for supporting a substrate (wafer) W, and an annular region (ring support surface) 111b for supporting the ring assembly 112. The annular region 111b of the main body 111 surrounds the central region 111a of the main body 111 in a plan view. The substrate W is placed on the central region 111a of the main body 111, and the ring assembly 112 is disposed on the annular region 111b of the main body 111 to surround the substrate W placed on the central region 111a of the main body 111. In an embodiment, the main body 111 includes a base and an electrostatic chuck. The base includes a conductive member. The conductive member of the base functions as a lower electrode. The electrostatic chuck is disposed on the base. The upper surface of the electrostatic chuck serves as the substrate support surface 111a. The ring assembly 112 includes one or more annular members. At least one of the one or more annular members is an edge ring. Although not illustrated, the substrate support 11 may include a temperature adjustment module configured to adjust at least one of the electrostatic chuck, the ring assembly 112, and the substrate to a target temperature. The temperature adjustment module may include a heater, a heat transfer medium, a flow path, or a combination thereof. A heat transfer fluid such as brine or a gas flows through the flow path. The substrate support 11 may include a heat transfer gas supply configured to supply a heat transfer gas to the space between the rear surface of the substrate W and the substrate support surface 111a.

The shower head 13 is configured to introduce at least one processing gas from the gas supply 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b, and is introduced into the plasma processing space 10s from the plurality of gas introduction ports 13c. The shower head 13 further includes a conductive member. The conductive member of the shower head 13 functions as an upper electrode. The gas introduction unit may include one or a plurality of side gas injectors (SGI) attached to one or a plurality of openings formed in the side wall 10a, in addition to the shower head 13.

The gas supply 20 may include at least one gas source 21 and at least one flow rate controller 22. In an embodiment, the gas supply 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. The gas supply 20 may further include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal, such as a source RF signal or a bias RF signal, to a conductive member of the substrate support 11 and/or the conductive member of the shower head 13. As a result, plasma is formed from at least one processing gas supplied to the plasma processing space 10s. Accordingly, the RF power supply 31 may function as at least a portion of a plasma generator configured to generate plasma from one or more processing gases in the plasma processing chamber 10. Further, by supplying the bias RF signal to the conductive member of the substrate support 11, a bias electric potential is generated in the substrate W, so that ion components in the formed plasma may be drawn into the substrate W.

In an embodiment, the RF power supply 31 includes a first RF generator 31a and a second RF generator 31b. The first RF generator 31a is coupled to the conductive member of the substrate support 11 and/or the conductive member of the shower head 13 via at least one impedance matching circuit, and configured to generate a source RF signal (source RF power) for generating plasma. In an embodiment, the RF signal has a frequency in the range of 13 MHz to 150 MHz. In an embodiment, the first RF generator 31a may be configured to generate multiple source RF signals having different frequencies. The generated one or more source RF signals are supplied to the conductive member of the substrate support 11 and/or the conductive member of the shower head 13. The second RF generator 31b is coupled to the conductive member of the substrate support 11 via at least one impedance matching circuit, and configured to generate a bias RF signal (bias RF power). In an embodiment, the bias RF signal has a frequency lower than that of the source RF signal. In an embodiment, the bias RF signal has a frequency in the range of 400 kHz to 13.56 MHz. In an embodiment, the second RF generator 31b may be configured to generate multiple bias RF signals having different frequencies. The generated one or more bias RF signals are supplied to the conductive member of the substrate support 11. In various embodiments, at least one of the source RF signal and the bias RF signal may be pulsed.

The power supply 30 may further include a direct current (DC) power supply 32 coupled to the plasma processing chamber 10. The DC power supply 32 includes a first DC generator 32a and a second DC generator 32b. In an embodiment, the first DC generator 32a is connected to the conductive member of the substrate support 11, and configured to generate a first DC signal. The generated first DC signal is applied to the conductive member of the substrate support 11. In an embodiment, the first DC signal may be applied to another electrode such as an electrode of the electrostatic chuck. In an embodiment, the second DC generator 32b is connected to the conductive member of the shower head 13, and configured to generate a second DC signal. The generated second DC signal is applied to the conductive member of the shower head 13. In various embodiments, at least one of the first and second DC signals may be pulsed. The first and second DC generators 32a and 32b may be provided in addition to the RF power supply 31, or the first DC generator 32a may be provided in place of the second RF generator 31b.

The exhaust system 40 may be connected to a gas exhaust port 10e provided at, for example, the bottom of the plasma processing chamber 10. The exhaust system 40 may include a pressure regulating valve and a vacuum pump. The pressure in the plasma processing space 10s is regulated by the pressure regulating valve. The vacuum pump may include a turbo molecular pump, a dry pump, or a combination thereof.

Figure 3:
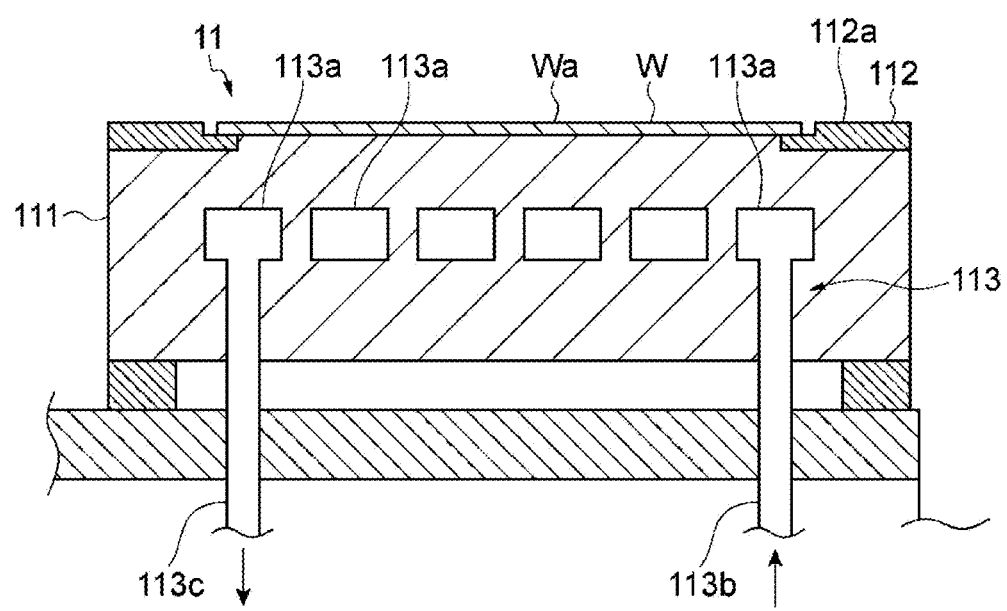
FIG. 3 is a partially enlarged view of a substrate processing apparatus according to an embodiment.

FIG. 3 is a partially enlarged view of a substrate processing apparatus according to an embodiment. As illustrated in FIG. 3, the substrate support 11 may include a temperature adjustment module 113 configured to adjust at least one of the main body 111, the ring assembly 112, and the substrate W to a target temperature. The temperature adjustment module 113 may include a heater, a heat transfer medium, a flow path, or a combination thereof. A heat transfer fluid such as brine or a gas flows through the flow path. In an embodiment, the temperature adjustment module 113 includes a coolant flow path 113a formed inside the main body 111. A cooling medium such as cooling water or brine output from a chiller unit flows through a coolant inlet pipe 113b, the coolant flow path 113a, and a coolant outlet pipe 113c, and returns to the chiller unit, which is then controlled to a predetermined temperature and circulates the route described above. As a result, the main body 111 is heat-released and cooled.

Figure 4:
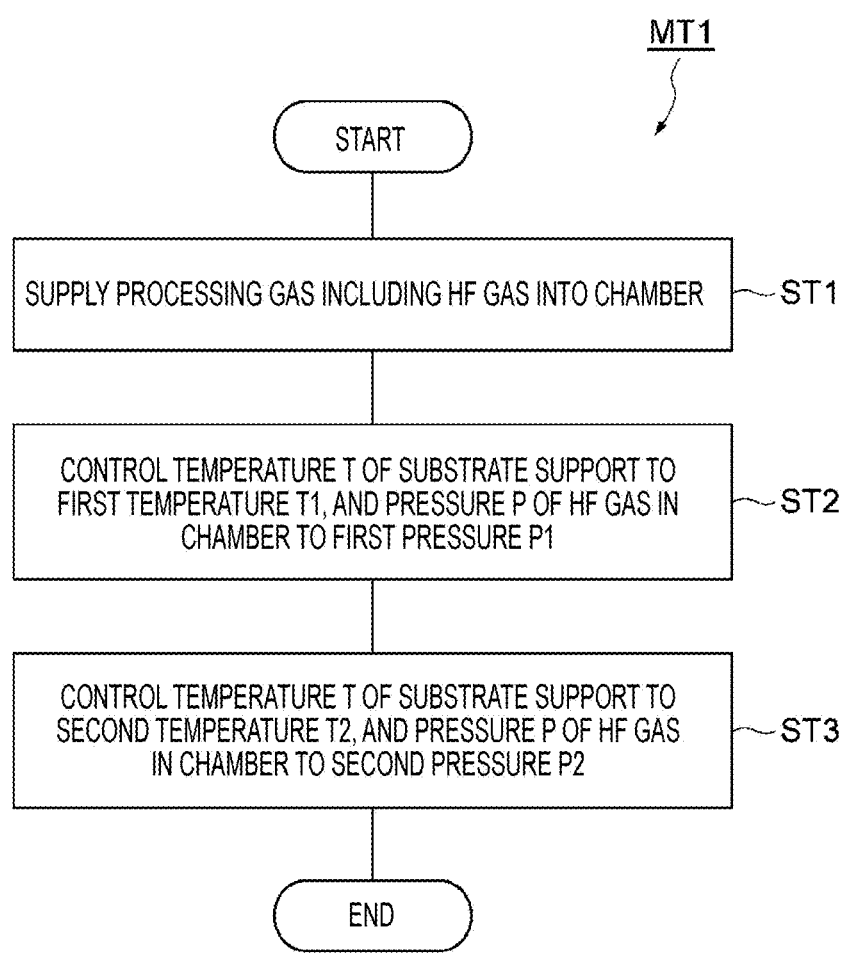
FIG. 4 is a flowchart of a substrate processing method according to an embodiment.

FIG. 4 is a flowchart of a substrate processing method according to an embodiment. The substrate processing method illustrated in FIG. 4 (hereinafter, referred to as a "method MT1") may be executed by the substrate processing apparatus of the embodiment described above. The method MTT is applied to the substrate W. The method MTT includes steps ST1, ST2, and ST3. Steps ST1, ST2, and ST3 are executed in this order. Step ST2 may be executed simultaneously with step ST1.

Hereinafter, the method MT1 will be described assuming an example where the method MT1 is applied to the substrate W by using the substrate processing apparatus of the embodiment described above. When the plasma processing apparatus 1 is used, the method MT1 may be executed in the plasma processing apparatus 1 through the control of each unit of the plasma processing apparatus 1 by the controller 2.

In the method MT1, the substrate W on the substrate support 11 disposed in the plasma processing chamber 10 as illustrated in FIG. 2 is processed. The substrate W may be cleaned (or etched) according to the method MT1.

Figure 5:
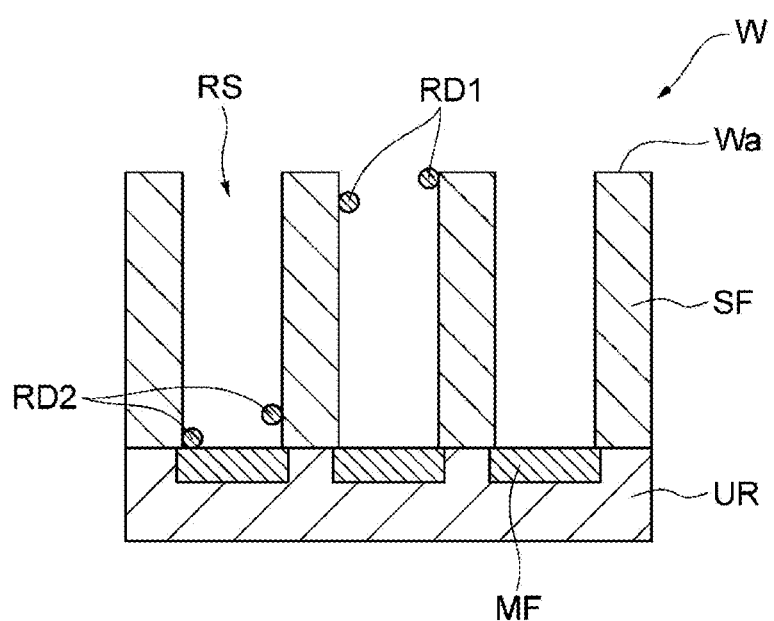
FIG. 5 is a partially enlarged cross-sectional view of an example of a substrate to which a substrate processing method according to an embodiment is applicable.

FIG. 5 is a partially enlarged cross-sectional view of an example of a substrate to which the substrate processing method according to an embodiment is applicable. As illustrated in FIG. 5, in an embodiment, the substrate W includes a base region UR, a metal-containing film MF, and a silicon-containing film SF. The silicon-containing film SF and the metal-containing film MF are provided on the base region UR, and positioned in the surface Wa of the substrate W.

The silicon-containing film SF may contain at least one of oxygen and nitrogen. The silicon-containing film SF may be a single-layer film or a multilayer film. The silicon-containing film SF may be a silicon film, a silicon oxide film, or a silicon nitride film.

The silicon-containing film SF may have one or more recesses RS. Each recess RS may be an opening. The recess RS is, for example, a hole or a trench. The recess RS may be formed by an etching using the plasma processing apparatus 1. The metal-containing film MF may be exposed at the bottom of the recess RS. The metal-containing film MF is not provided below the portion of the silicon-containing film SF between the adjacent recesses RS.

A mask may be formed on the silicon-containing film SF to be used for forming the recess RS through an etching. The mask includes, for example, carbon. An etching residue RD1 or RD2 generated, for example, when the recess RS is formed through an etching may adhere to the surface Wa of the substrate W. The etching residue RD1 is a residue (reaction by-product) generated from the silicon-containing film SF. The etching residue RD2 is a residue (reaction by-product) generated from the metal-containing film MF.

In step ST1, a processing gas including hydrogen fluoride gas is supplied into the plasma processing chamber 10. The processing gas may substantially include the hydrogen fluoride gas alone, or may include a gas other than the hydrogen fluoride gas. In an embodiment, the processing gas includes hydrogen fluoride gas and an inert gas. Examples of the inert gas include a noble gas such as argon gas.

In step ST2, the temperature T of the substrate support 11 is controlled to a first temperature T1, and the pressure P of the hydrogen fluoride gas in the plasma processing chamber 10 is controlled to a first pressure P1. The controller 2 is configured to perform the controls.

Figure 6:
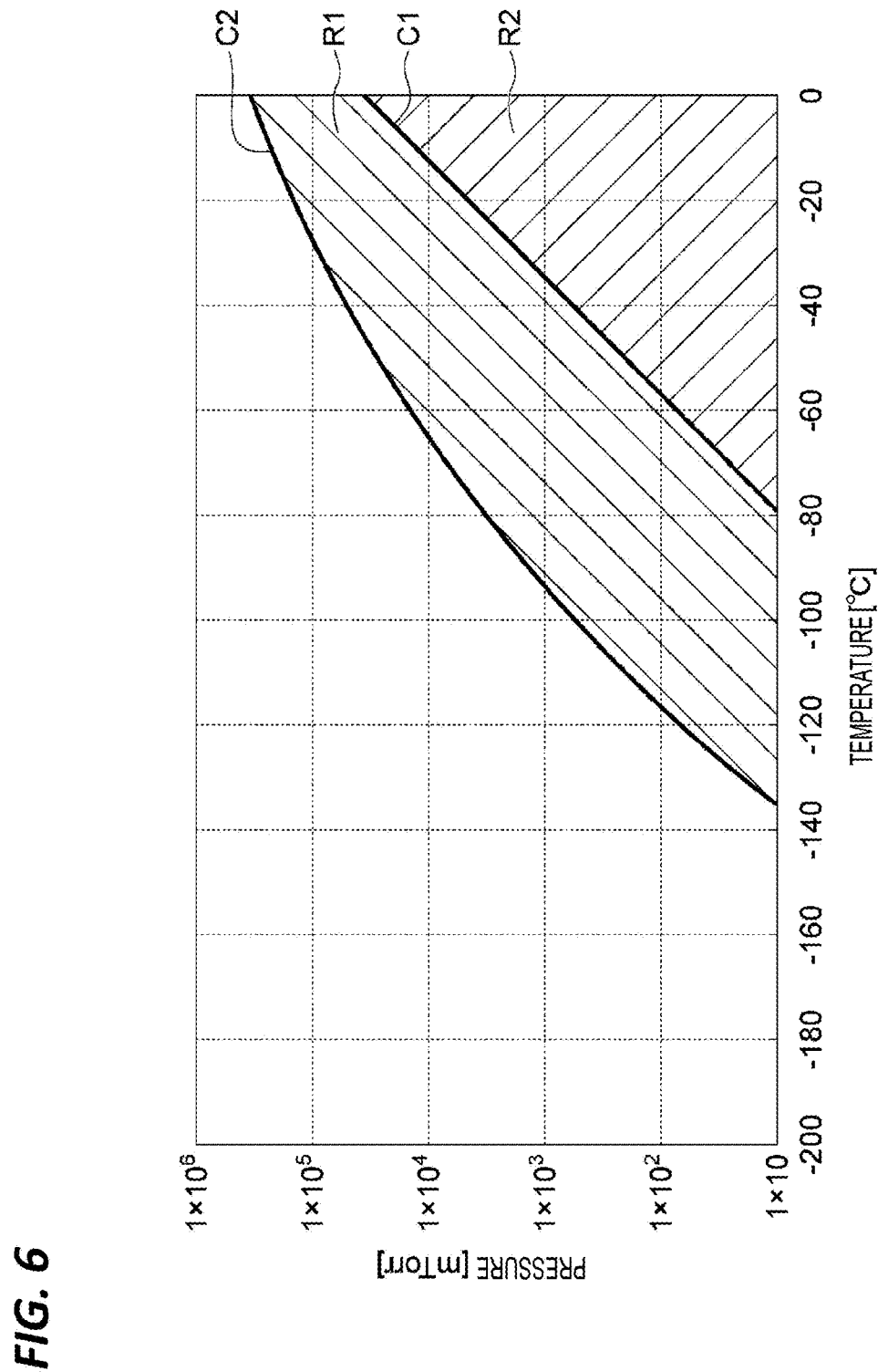
FIG. 6 is a graph representing an example of an adsorption equilibrium pressure curve and a saturated vapor pressure curve of hydrogen fluoride.

FIG. 6 is a graph representing an example of an adsorption equilibrium pressure curve and a saturated vapor pressure curve of hydrogen fluoride. The horizontal axis represents the temperature (° C.). The vertical axis represents the pressure (mTorr). At the temperature and the pressure on an adsorption equilibrium pressure curve C1 in the graph of FIG. 6, the adsorption and the desorption of hydrogen fluoride are in equilibrium. The adsorption equilibrium pressure curve C1 may be drawn by an exponential function approximated using measurement data based on the Brunauer-Emmet-Teller (BET) adsorption theory.

The first temperature T1 and the first pressure P1 are present in a first region R1 above the adsorption equilibrium pressure curve C1 of hydrogen fluoride. As a result, in step ST2, hydrogen fluoride is adsorbed onto the surface Wa of the substrate W. The first region R1 may be present below the saturated vapor pressure curve C2 of hydrogen fluoride. In this case, hydrogen fluoride is adsorbed onto the surface Wa of the substrate W in a gas phase. When the first temperature T1 and the first pressure P1 are present above the saturated vapor pressure curve C2, hydrogen fluoride is adsorbed onto the surface Wa of the substrate W in a liquid phase. The first temperature T1 may be in the range of $-140°$ C. or higher and $0°$ C. or lower, or may be in the range of $-70°$ C. or higher and $-30°$ C. or lower. The first pressure P1 may be in the range of 1 Pa or more and $1\times10^5$ Pa or less, or may be in the range of 30 Pa or more and 100 Pa or less. The time for step ST2 is not limited as long as the time falls within a range in which a reaction product is produced as a result of the adsorption of hydrogen fluoride, and a cleaning amount is determined according to the time for step ST2. The temperature T of the substrate support 11 may be adjusted using the temperature adjustment module 113. The temperature of the substrate W may be the same as the temperature T of the substrate support 11. The pressure P of the hydrogen fluoride gas in the plasma processing chamber 10 may be regulated by controlling the flow rate of the hydrogen fluoride gas using the flow rate controller 22. When the processing gas includes a gas other than the hydrogen fluoride gas, the pressure P of the hydrogen fluoride gas in the plasma processing chamber 10 is a partial pressure of the hydrogen fluoride gas. No plasma is generated in step ST2.

Figure 7:
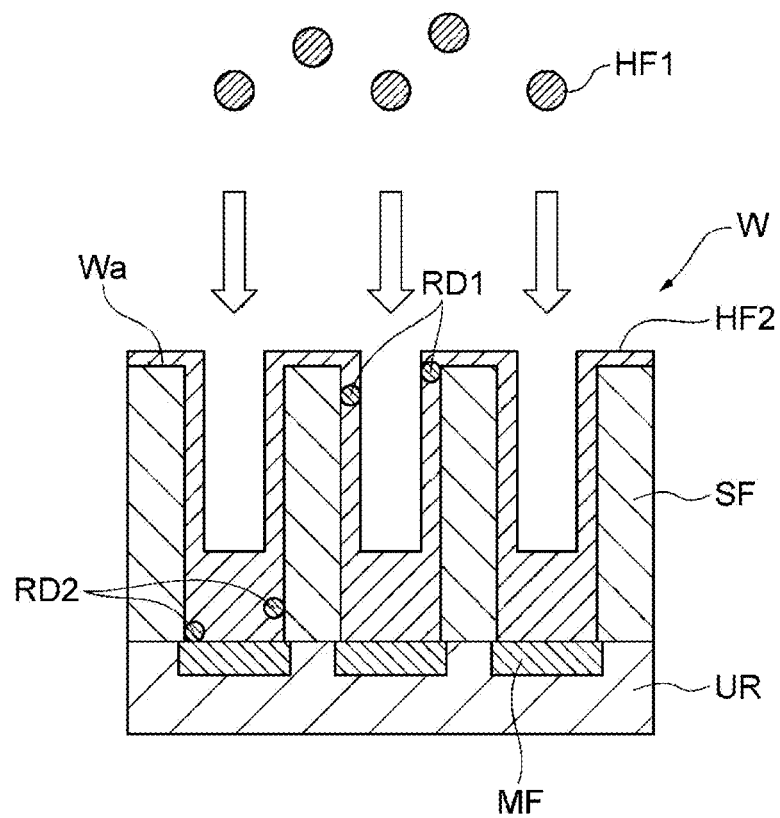
FIG. 7 is a partially enlarged cross-sectional view of an example of a substrate in a case where hydrogen fluoride is adsorbed onto the surface of the substrate.

FIG. 7 is a partially enlarged cross-sectional view of an example of a substrate in a case where hydrogen fluoride is adsorbed onto the surface of the substrate. As illustrated in FIG. 7, hydrogen fluoride is adsorbed onto the surface Wa of the substrate W. A hydrogen fluoride molecule HF1 in the hydrogen fluoride gas may be adsorbed onto the surface Wa of the substrate W. As a result, a layer HF2 containing hydrogen fluoride may be formed on the surface Wa of the substrate W. The layer HF2 is, for example, a hydrogen fluoride molecular layer. The layer HF2 is formed to cover the etching residue RD1 or RD2. The hydrogen fluoride of the layer HF2 may react with the etching residue RD1 or RD2 to produce a reaction product HF3 (see FIG. 8) such as silicon fluoride.

Prior to step ST1, a processing gas including an inert gas without including hydrogen fluoride gas may be supplied into the plasma processing chamber 10. In this case, the temperature T of the substrate support 11 may be controlled to the first temperature T1, and the pressure of the inert gas in the plasma processing chamber 10 may be controlled to the first pressure P1. Thereafter, steps ST1 and ST2 may be started at the same time, by replacing the processing gas including the inert gas with the processing gas including the hydrogen fluoride gas.

In step ST3, the temperature T of the substrate support 11 is controlled to a second temperature T2, and the pressure P of the hydrogen fluoride gas in the plasma processing chamber 10 is controlled to a second pressure P2. The controller 2 is configured to perform the controls. In the graph of FIG. 6, the second temperature T2 and the second pressure P2 are present in a second region R2 below the adsorption equilibrium pressure curve C1. As a result, in step ST3, the hydrogen fluoride adsorbed onto the surface Wa of the substrate W is desorbed. The second temperature T2 may be in the range of $-140°$ C. or higher and $0°$ C. or lower, or may be in the range of $-70°$ C. or higher and $-30°$ C. or lower. The second pressure P2 may be in the range of 1 Pa or more and $1\times10^5$ Pa or less, or may be in the range of 30 Pa or more and 100 Pa or less. The time for step ST3 is not limited as long as the time falls within a range in which the reaction product resulting from the adsorption of hydrogen fluoride is desorbed. The second temperature T2 may be higher than the first temperature T1. The second pressure P2 may be lower than the first pressure P1. Step ST3 may be performed after the supply of the processing gas including the hydrogen fluoride gas is stopped, in order to promote the desorption of hydrogen fluoride. No plasma is generated in step ST3.

Figure 8:
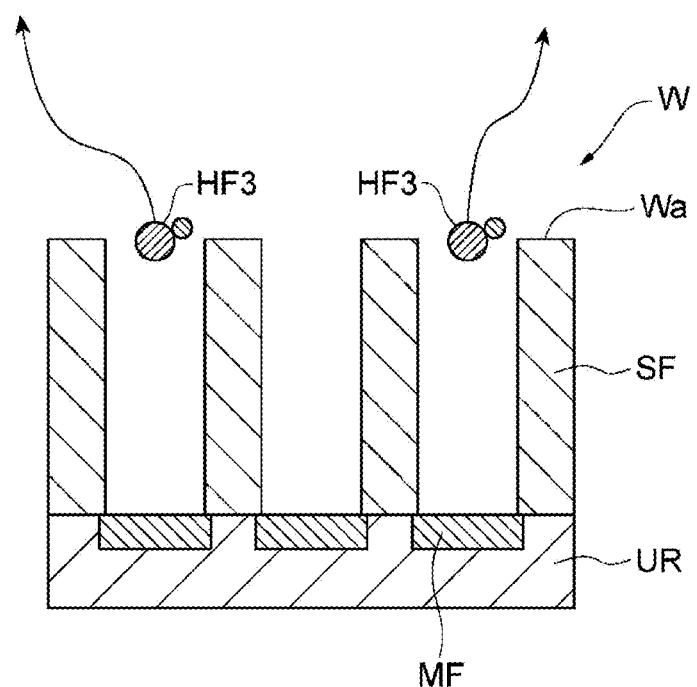
FIG. 8 is a partially enlarged cross-sectional view of an example of a substrate in a case where adsorbed hydrogen fluoride is desorbed.

FIG. 8 is a partially enlarged cross-sectional view of an example of a substrate in a case where adsorbed hydrogen fluoride is desorbed. In step ST3, the hydrogen fluoride adsorbed onto the surface Wa of the substrate W is desorbed. The hydrogen fluoride molecules adsorbed onto the surface Wa of the substrate W are desorbed and formed into hydrogen fluoride gas. With the desorption of hydrogen fluoride, the etching residue RD1 or RD2 may be separated from the surface Wa of the substrate W. As illustrated in FIG. 8, the reaction product HF3 produced in step ST2 is desorbed from the surface Wa of the substrate W. In this way, in step ST3, the etching residue RD 1 or RD 2 may be removed from the surface Wa of the substrate W.

According to the method MT1 described above, for example, when a substance such as the etching residue RD1 or RD2 exists on the surface Wa of the substrate W, the substance may be removed with the desorption of hydrogen fluoride.

When the substrate W includes the silicon-containing film SF, a substance generated from the silicon-containing film SF may be removed with the desorption of hydrogen fluoride. When the substrate W includes the metal-containing film MF, a substance generated from the metal-containing film MF may be removed with the desorption of hydrogen fluoride.

When the processing gas includes an inert gas, the amount of a substance to be removed may be adjusted by adjusting the flow rate ratio of the inert gas. For example, when the flow rate ratio of the inert gas is increased, the flow rate ratio of the hydrogen fluoride gas decreases, so that the amount of the substance to be removed is reduced.

Prior to step ST1, the substrate W may be etched using plasma generated in the plasma processing chamber 10. For example, steps ST1, ST2, and ST3 may be performed after the recess RS is formed through an etching. As a result, an etching and a cleaning may be continuously performed in situ without taking the substrate W out from the plasma processing chamber 10.

Figure 9:
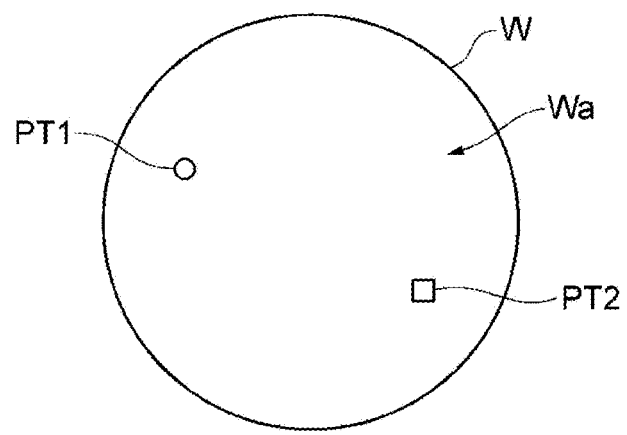
FIG. 9 is a plan view of an example of a substrate having a surface to which a substance produced from a substrate processing apparatus adheres.

FIG. 9 is a plan view of an example of a substrate having a surface to which a substance produced from the substrate processing apparatus adheres. As illustrated in FIG. 9, in step ST2, a substance produced from the substrate processing apparatus of the above-described embodiment may adhere to the surface Wa of the substrate W. The substance may be a silicon-containing particle PT1 produced from the plasma processing apparatus 1 or a metal-containing particle PT2 produced from the plasma processing apparatus 1. The silicon-containing particle PT1 contains, for example, silicon oxide. The metal-containing particle PT2 contains, for example, yttrium or aluminum. The metal-containing particle PT2 contains, for example, yttrium oxide or aluminum oxide.

When the method MTT is applied to the substrate W of FIG. 9, the substance such as the silicon-containing particle PT1 or the metal-containing particle PT2 may be removed.

Figure 10:
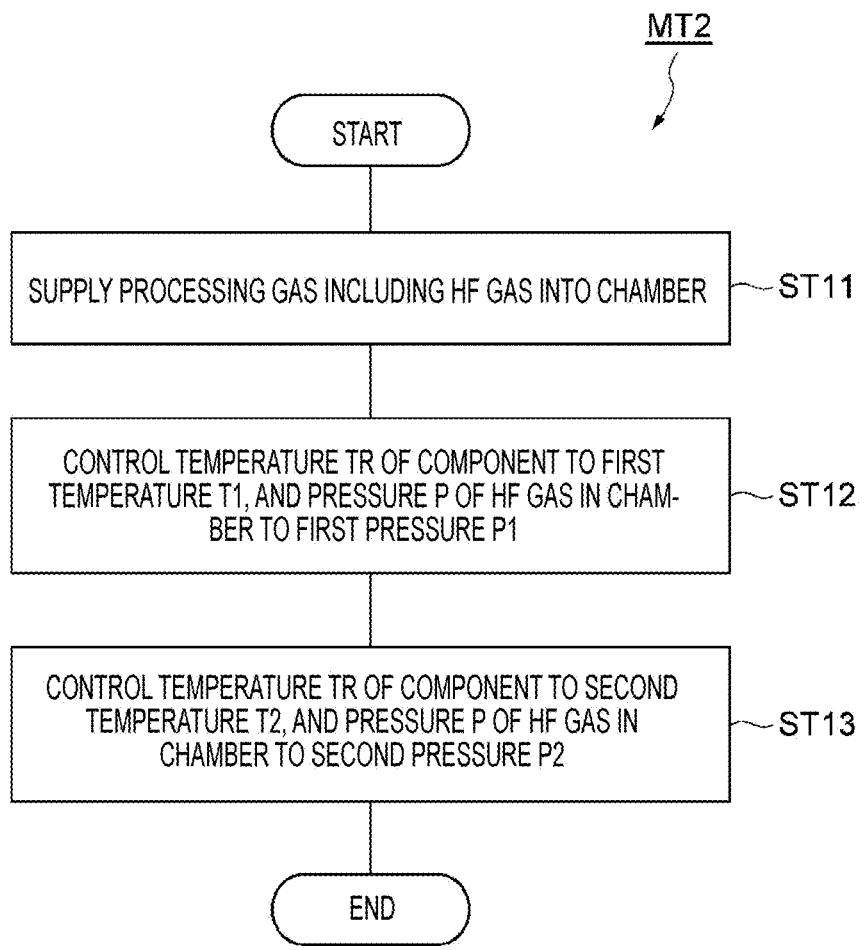
FIG. 10 is a flowchart of a component processing method according to an embodiment.

FIG. 10 is a flowchart of a component processing method according to an embodiment. The component processing method illustrated in FIG. 10 (hereinafter, referred to as a "method MT2") may be executed by the substrate processing apparatus of the above-described embodiment. The method MT2 is applied to the plasma processing apparatus 1. When the method MT2 is executed, the substrate W may not be present in the plasma processing chamber 10. The method MT2 includes steps ST11, ST12, and ST13. Steps ST11, ST12, and ST13 are executed in this order. Step ST12 may be executed simultaneously with step ST11.

Hereinafter, the method MT2 will be described assuming an example where the method MT2 is applied to the ring assembly 112 (see FIG. 3) by using the substrate processing apparatus of the above-described embodiment. When the plasma processing apparatus 1 is used, the method MT2 may be executed in the plasma processing apparatus 1 through the control of each unit of the plasma processing apparatus 1 by the controller 2.

The method MT2 processes the ring assembly 112 which is a component disposed in the plasma processing chamber 10. For example, the substance such as the silicon-containing particle PT1 or the metal-containing particle PT2 illustrated in FIG. 9 may adhere to the surface 112a of the ring assembly 112. The ring assembly 112 may be cleaned (or etched) according to the method MT2.

In step ST11, the processing gas including hydrogen fluoride gas is supplied into the plasma processing chamber 10. Step ST11 may be executed in the same manner as step ST1, except that the substrate W is not placed on the substrate support 11.

In step ST12, the temperature TR of the ring assembly 112 is controlled to the first temperature T1, and the pressure P of the hydrogen fluoride gas in the plasma processing chamber 10 is controlled to the first pressure P1. As a result, hydrogen fluoride is adsorbed onto the surface 112a of the ring assembly 112. Step ST12 may be executed in the same manner as step ST2, except that the substrate W is not placed on the substrate support 11. The temperature TR of the ring assembly 112 may be the same as the temperature T of the substrate support 11, and may be adjusted by using the temperature adjustment module 113. The temperature TR of the ring assembly 112 may be adjusted by using a temperature adjustment module different from the temperature adjustment module 113.

In step ST13, the temperature TR of the ring assembly 112 is controlled to the second temperature T2, and the pressure P of the hydrogen fluoride gas in the plasma processing chamber 10 is controlled to the second pressure P2. As a result, the hydrogen fluoride adsorbed onto the surface 112a of the ring assembly 112 is desorbed. Step ST13 may be executed in the same manner as step ST3, except that the substrate W is not placed on the substrate support 11.

According to the method MT2 described above, when the substance such as the silicon-containing particle PT1 or the metal-containing particle PT2 exists on the surface 112a of the ring assembly 112, the substance may be removed with the desorption of hydrogen fluoride.

Hereinafter, descriptions will be made assuming an example where the method MT1 is applied to a substrate W1 by using the substrate processing apparatus of the above-described embodiment. In this case, when the method MT1 is executed, the substrate W1 is used, instead of the substrate W described above. The substrate W1 may be cleaned (or etched) according to the method MT1.

Figure 11:
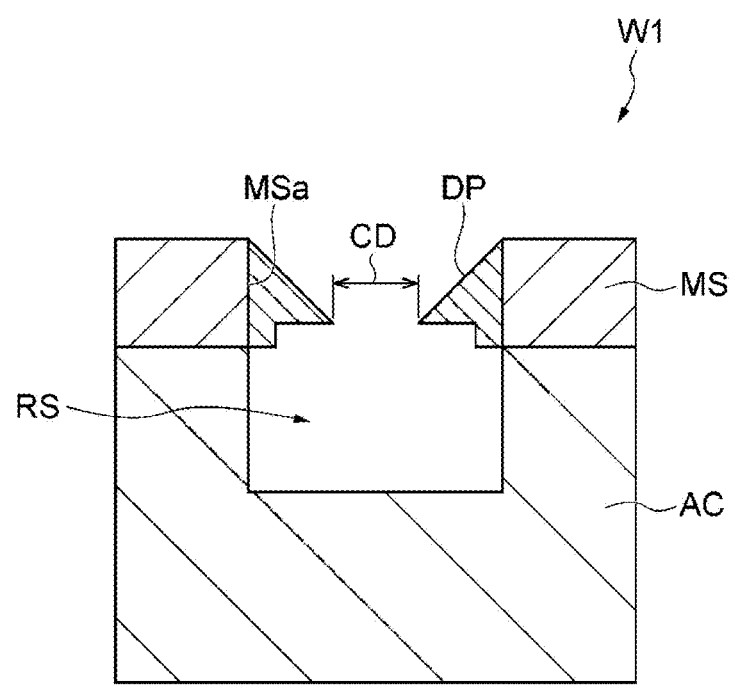
FIG. 11 is a partially enlarged cross-sectional view of an example of a substrate to which a substrate processing method according to an embodiment is applicable.

FIG. 11 is a partially enlarged cross-sectional view of an example of a substrate to which a substrate processing method according to an embodiment is applicable. As illustrated in FIG. 11, in an embodiment, the substrate W1 includes a carbon-containing film AC and a mask MS provided on the carbon-containing film AC. The carbon-containing film AC may have one or more recesses RS. The carbon-containing film AC may be an amorphous carbon film. The mask MS may be a mask for forming the recess RS through an etching. The mask MS may have an opening MSa positioned on the recess RS. The mask MS may be a film containing silicon, oxygen, and nitrogen. For example, a deposit DP generated when the recess RS is formed through an etching may adhere to the opening MSa of the mask MS. The deposit DP may contain silicon and oxygen. The dimension CD of the opening MSa of the mask MS may be reduced due to the deposit DP.

Figure 12:
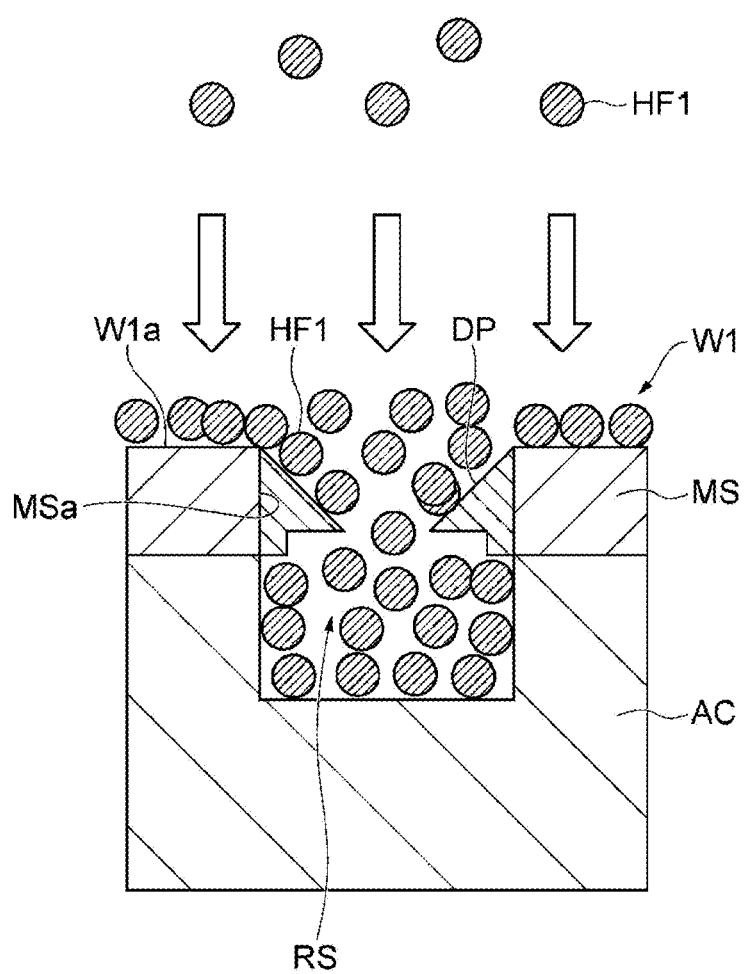
FIG. 12 is a partially enlarged cross-sectional view of an example of a substrate in a case where hydrogen fluoride is adsorbed onto the surface of the substrate.

FIG. 12 is a partially enlarged cross-sectional view of an example of a substrate in a case where hydrogen fluoride is adsorbed onto the surface of the substrate. As illustrated in FIG. 12, in step ST12, hydrogen fluoride is adsorbed onto the surface W1a of the substrate W1. The hydrogen fluoride molecule HF1 in the hydrogen fluoride gas may be adsorbed onto the opening MSa of the mask MS. As a result, an adsorption layer containing hydrogen fluoride may be formed on the surface W1a of the substrate W1. The adsorption layer is formed to cover the deposit DP. Hydrogen fluoride in the adsorption layer may react with the deposit DP to produce the reaction product HF3 (see FIG. 13) such as silicon fluoride.

Figure 13:
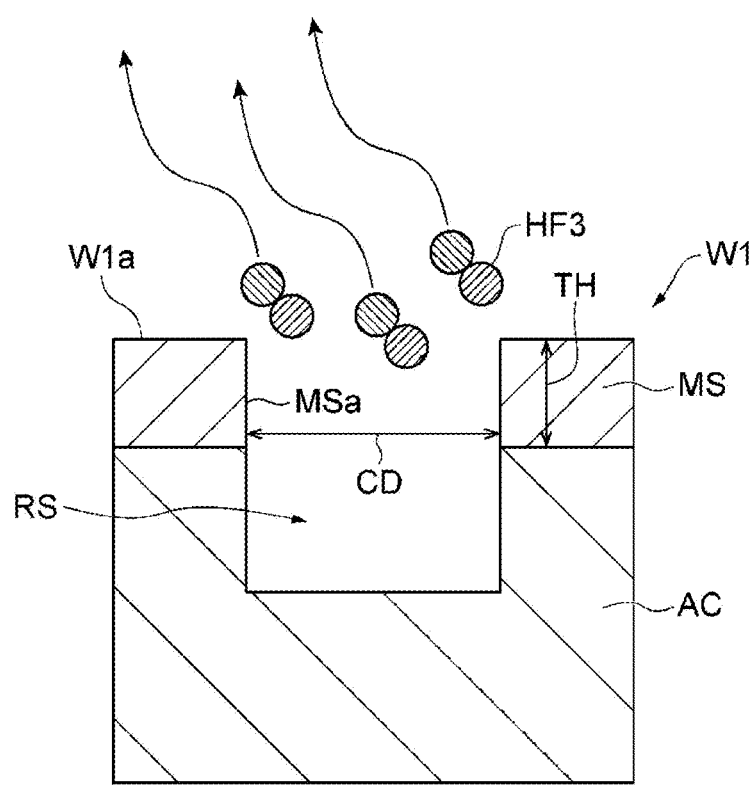
FIG. 13 is a partially enlarged cross-sectional view of an example of a substrate in a case where adsorbed hydrogen fluoride is desorbed.

FIG. 13 is a partially enlarged cross-sectional view of an example of a substrate in a case where adsorbed hydrogen fluoride is desorbed. In step ST3, the hydrogen fluoride adsorbed onto the surface W1a of the substrate W1 is desorbed. The hydrogen fluoride molecules adsorbed onto the surface W1a of the substrate W1 are desorbed and formed into hydrogen fluoride gas. With the desorption of hydrogen fluoride, the deposit DP may be separated from the surface W1a of the substrate W1. As illustrated in FIG. 13, the reaction product HF3 produced in step ST2 is desorbed from the opening MSa of the mask MS. Thus, in step ST3, the deposit DP may be removed from the surface Wia of the substrate W1.

According to the method MT1 described above, for example, when the substance such as the deposit DP exists on the opening MSa of the mask MS, the substance may be removed with the desorption of hydrogen fluoride. According to the method MT1, the dimension CD of the opening MSa of the mask MS may be increased while suppressing the reduction in thickness TH of the mask MS, as compared with a case where the substance is removed by a plasma etching.

Hereinafter, various experiments conducted for evaluating the method MT1 will be described. The experiments described below do not limit the present disclosure.

(First Experiment)

In a first experiment, a substrate W having a silicon oxide film and a mask on the silicon oxide film was prepared. The silicon oxide film was etched using the mask, so as to form the recess RS. Then, the method MT1 was executed on the substrate W using the above-described plasma processing system. In step ST2, the first temperature T1 was −70° C., and the first pressure P1 was 50 Pa. In step ST3, the second temperature T2 was −70° C., and the second pressure P2 was 2 Pa.

Figure 14B:
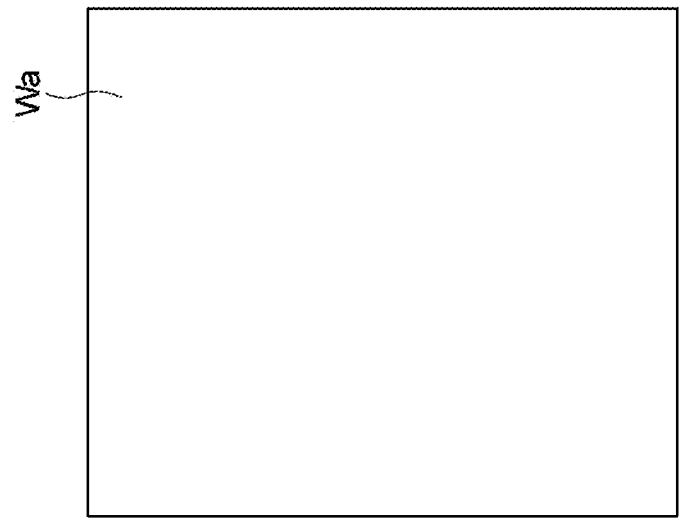
FIGS. 14A and 14B are partially enlarged plan views of an example of the surface of a substrate.
Figure 14A:
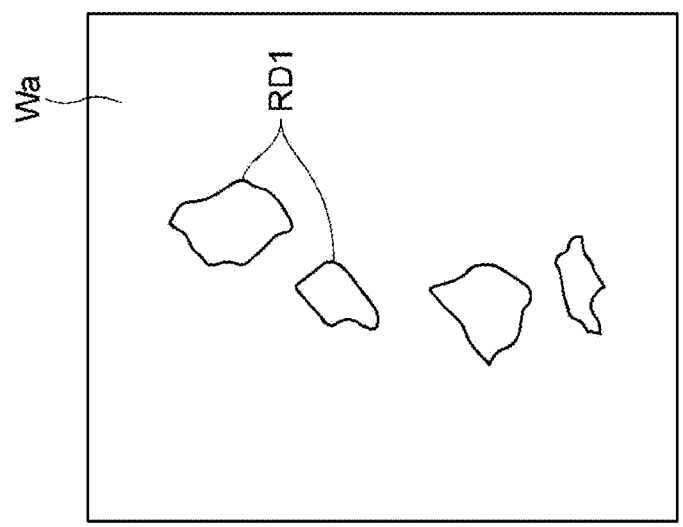

FIGS. 14A and 14B are partially enlarged plan views of an example of the surface of the substrate. FIG. 14A represents the surface Wa of the substrate W before the method MT1 is executed. FIG. 14B represents the surface Wa of the substrate W after the method MT1 is executed. In FIG. 14A, the etching residue RD1 adheres to the surface Wa of the substrate W. Meanwhile, in FIG. 14B, the etching residue RD1 has been removed from the surface Wa of the substrate W. The same effect is obtained as in a case where the hydrogen fluoride solution is used.

(Second Experiment)

Figure 15:
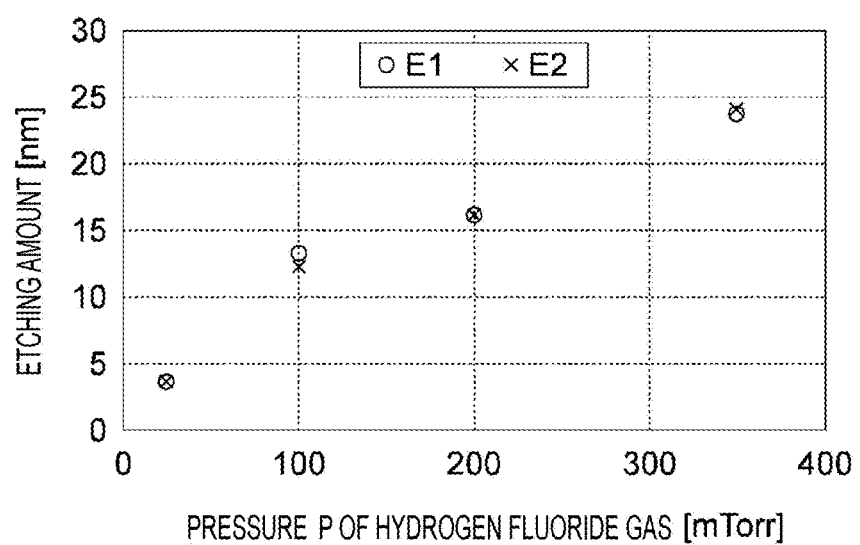
FIG. 15 is a graph representing an example of a relationship between a pressure of hydrogen fluoride gas and an etching amount.
Figure 16:
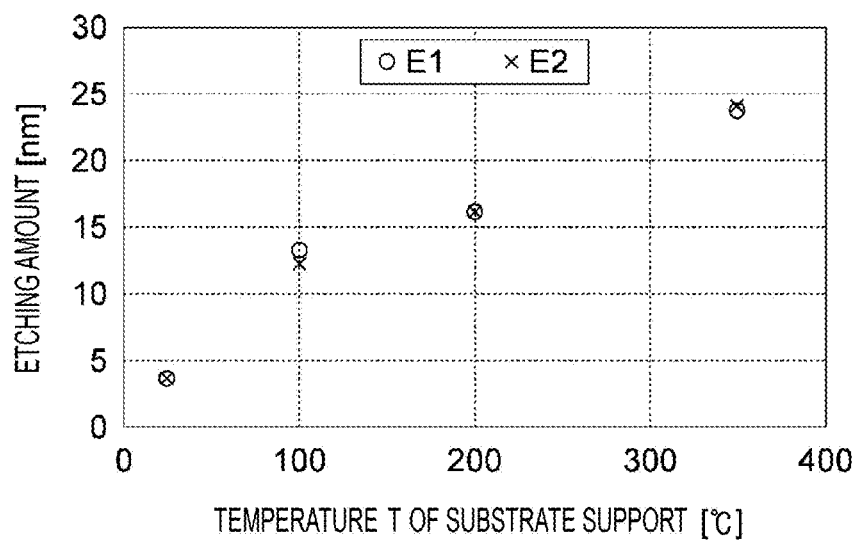
FIG. 16 is a graph representing an example of a relationship between a temperature of a substrate support and an etching amount.

In a second experiment, a substrate W having a silicon oxide film was prepared. While fixing the temperature T of the substrate support 11 to −70° C., and changing the pressure P of the hydrogen fluoride gas in the plasma processing chamber 10, the method MT1 was executed on the substrate W. Then, the etching amount (film thickness reduction amount) of the silicon oxide film was measured. As the etching amount increases, the cleaning effect is improved. FIG. 15 represents the result. Further, while fixing the pressure P of the hydrogen fluoride gas in the plasma processing chamber 10 to 350 mTorr (1 mTorr=0.133322 Pa), and changing the temperature T of the substrate support 11, the method MT1 described above was executed on the substrate W. Then, the etching amount of the silicon oxide film was measured. FIG. 16 represents the result.

FIG. 15 is a graph representing an example of a relationship between the pressure of the hydrogen fluoride gas and the etching amount. The vertical axis represents the etching amount (nm). The horizontal axis represents the pressure P (mTorr) of the hydrogen fluoride gas. Two experiments were conducted for each pressure P. E1 and E2 represent results of the two experiments. From FIG. 15, it is found that the etching amount increases with the increase of the pressure P. Accordingly, the etching amount may be controlled by adjusting the pressure P. It is also found that the controllability of the etching amount is improved in the low pressure region of 200 mTorr or less. It is also found that the rising profile of the pressure P is similar to the Langmuir adsorption line. This indicates the possibility that the adsorption and the desorption of hydrogen fluoride gas molecules are dominant.

FIG. 16 is a graph representing an example of a relationship between a temperature of a substrate support and an etching amount. The vertical axis represents the etching amount (nm). The horizontal axis represents the temperature T (° C.) of the substrate support 11. Two experiments were conducted for each temperature T. E3 and E4 represent results of the two experiments. From FIG. 16, it is found that the etching amount decreases with the increase of the temperature T. When the temperature T is −35° C., the etching amount decreases, as compared with a case where the temperature T is −70° C.

(Third Experiment)

Figure 17:
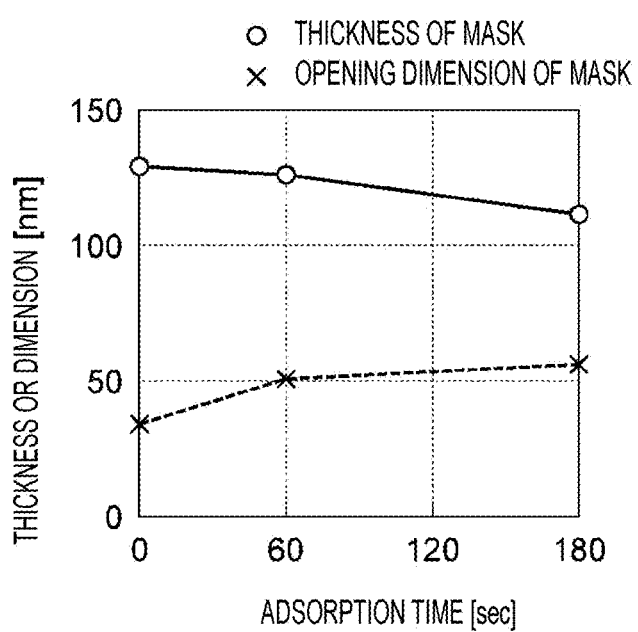
FIG. 17 is a graph representing an example of a relationship between an adsorption time and a thickness of a mask or a dimension of an opening of the mask.

In a third experiment, the substrate W1 having an amorphous carbon film and a mask on the amorphous carbon film (see FIG. 11) was prepared. The mask is a SiON film. The amorphous carbon film was etched using the mask, so as to form the recess RS. Then, the method MT1 was executed on the substrate W1 using the plasma processing system, while changing the time in step ST2 (adsorption time). The first temperature T1 and the first pressure P1 in step ST2 are present in the first region R1 above the adsorption equilibrium pressure curve C1 of hydrogen fluoride. Then, the thickness and the opening dimension of the mask were measured. FIG. 17 represents the result.

FIG. 17 is a graph representing an example of a relationship between the adsorption time and the thickness or the opening dimension of the mask. The vertical axis represents the thickness or the opening dimension (nm) of the mask. The horizontal axis represents the adsorption time (seconds). The result in which the adsorption time is zero indicates the thickness or the dimension in the substrate W1 before the method MTT is executed. From FIG. 17, it is found that when the adsorption time is about 60 seconds, the opening dimension of the mask may be increased while suppressing the reduction in thickness of the mask.

(Fourth Experiment)

Figure 18:
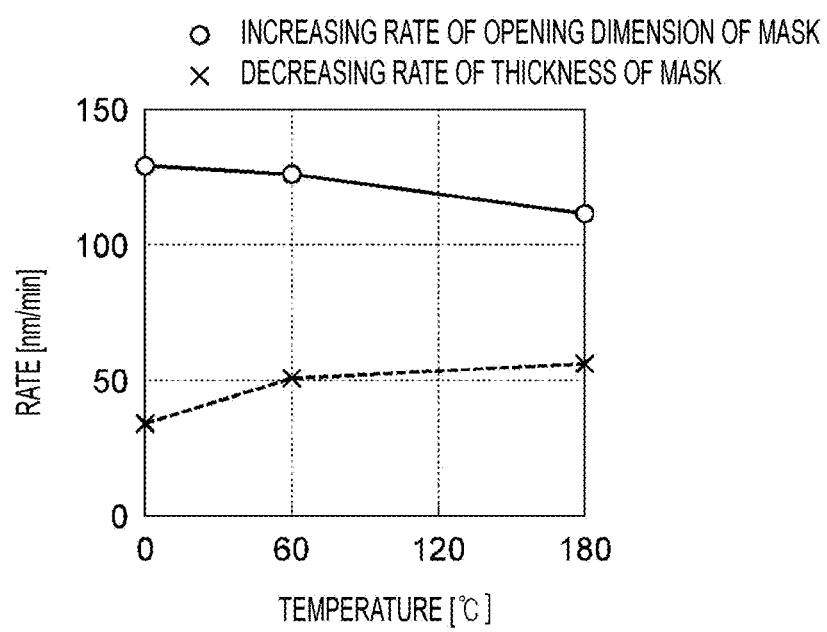
FIG. 18 is a graph representing an example of a relationship between a temperature and a decreasing rate of a thickness of a mask or an increasing rate of an opening dimension of the mask.

In a fourth experiment, the same substrate W1 as that in the third experiment was prepared, and the amorphous carbon film was etched using the mask so as to form the recess RS. Then, the method MT1 was executed on the substrate W1 using the above-described plasma processing system, while changing the first temperature T1 in step ST2. The first temperature T1 and the first pressure P1 in step ST2 are present in the first region R1 above the adsorption equilibrium pressure curve C1 of hydrogen fluoride. Then, the thickness and the opening dimension of the mask were measured, and the decreasing rate of the thickness of the mask and the increasing rate of the opening dimension of the mask were calculated. FIG. 18 represents the result.

FIG. 18 is a graph representing an example of a relationship between the temperature and the decreasing rate of the thickness of the mask or the increasing rate of the opening dimension of the mask. The vertical axis represents the decreasing rate of the thickness of the mask or the increasing rate of the opening dimension of the mask (nm/min). The horizontal axis represents the temperature (° C.). From FIG. 18, it is found that as the temperature decreases, the opening dimension of the mask may be increased while suppressing the reduction in thickness of the mask.

(Fifth Experiment)

Figure 19:
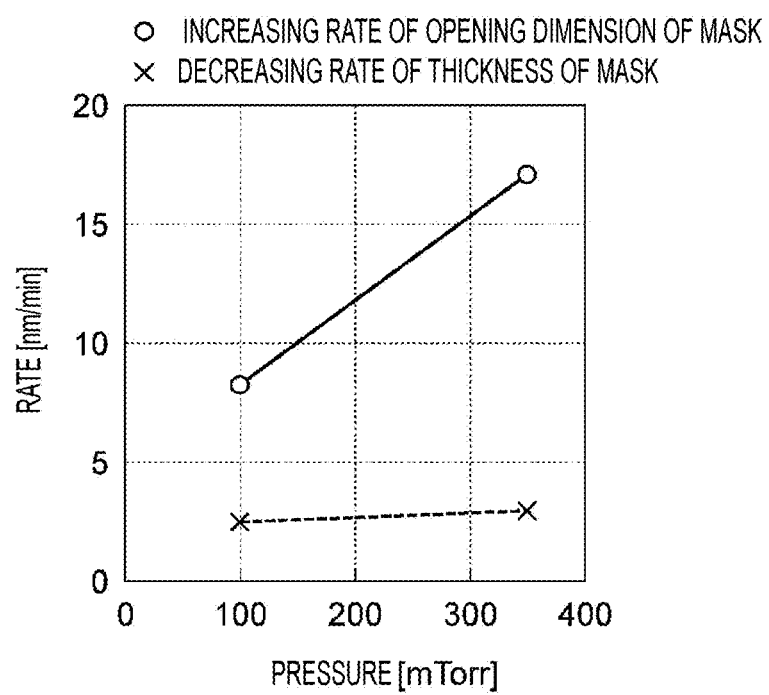
FIG. 19 is a graph representing an example of a relationship between a pressure and a decreasing rate of a thickness of a mask or an increasing rate of an opening dimension of the mask.

In a fifth experiment, the same substrate W1 as that in the third experiment was prepared, and the amorphous carbon film was etched using the mask so as to form the recess RS. Then, the method MTT was executed on the substrate W1 using the above-described plasma processing system, while changing the first temperature P1 in step ST2. The first temperature T1 and the first pressure P1 in step ST2 are present in the first region R1 above the adsorption equilibrium pressure curve C1 of hydrogen fluoride. Then, the thickness and the opening dimension of the mask were measured, and the decreasing rate of the thickness of the mask and the increasing rate of the opening dimension of the mask were calculated. FIG. 19 represents the result.

FIG. 19 is a graph representing an example of a relationship between the pressure and the decreasing rate of the thickness of the mask or the increasing rate of the opening dimension of the mask. The vertical axis represents the decreasing rate of the thickness of the mask or the increasing rate of the opening dimension of the mask (nm/min). The horizontal axis represents the pressure P (mTorr). From FIG. 19, it is found that as the pressure increases, the opening dimension of the mask may be increased while suppressing the reduction in thickness of the mask.

Figure 20:
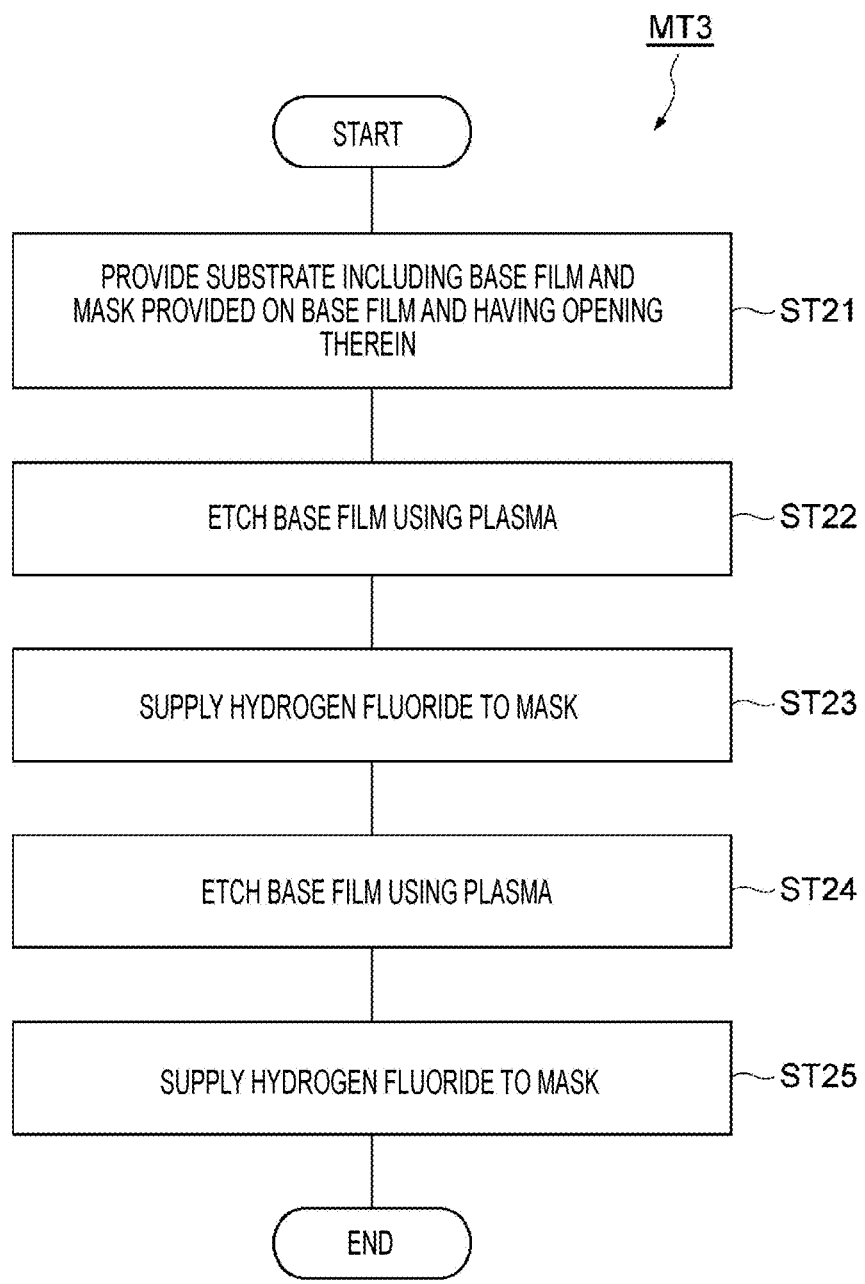
FIG. 20 is a flowchart of a substrate processing method according to an embodiment.

FIG. 20 is a flowchart of a substrate processing method according to an embodiment. The substrate processing method illustrated in FIG. 20 (hereinafter, referred to as a "method MT3") may be executed by the substrate processing apparatus of the above-described embodiment. When the plasma processing apparatus 1 is used, the method MT3 may be executed in the plasma processing apparatus 1 through the control of each unit of the plasma processing apparatus 1 by the controller 2. The method MT3 includes steps ST21, ST22, ST23, ST24, and ST25. Steps ST21 to ST25 may be executed in this order. Steps ST21 to ST25 may be performed in situ or in different chambers. For example, steps ST21, ST22, and ST24 may be performed in the plasma processing chamber 10, and steps ST23 and ST25 may be performed in a chamber different from the plasma processing chamber 10. Steps ST23 and ST25 may be performed in a batch or single-wafer manner. At least one of steps ST24 and ST25 may be omitted.

Hereinafter, referring to FIGS. 11 to 13 and 20, descriptions will be made assuming an example where the method MT3 is applied to the substrate W1 by using the substrate processing apparatus of the above-described embodiment. The substrate W1 may be cleaned (or etched) according to the method MT3.

In step ST21, the substrate W1 is provided. The substrate W1 includes the carbon-containing film AC as a base film, and the mask MS provided on the carbon-containing film AC and having the opening MSa. As illustrated in FIG. 2, the substrate W1 may be placed on the substrate support 11 disposed in the plasma processing chamber 10.

The mask MS may contain silicon. The mask MS may be a silicon-containing film. The silicon-containing film may include at least one of a silicon film, a silicon nitride film, a silicon carbide film, and a silicon oxynitride film. The silicon-containing film may not include a silicon oxide film.

The carbon-containing film AC may be any film that contains carbon, and may include, for example, at least one of a spin-on carbon (SOC) film, an amorphous carbon film, and a resist film. The resist film may be, for example, an ArF resist film or a KrF resist film. A film different from the carbon-containing film AC may be used as the base film. As for the base film different from the carbon-containing film AC, for example, at least one of a polycrystalline silicon film, an amorphous silicon film, and a SiGe film may be used.

In step ST22, the carbon-containing film AC is etched using plasma, as illustrated in FIG. 11. The plasma may be generated from a first processing gas supplied into the plasma processing chamber 10. The recess RS is formed in the carbon-containing film AC through the etching, and the deposit DP adheres to the opening MSa of the mask MS.

In step ST23, hydrogen fluoride is supplied to the mask MS so as to remove the deposit DP, as illustrated in FIGS. 12 and 13. In an embodiment, a second processing gas that includes hydrogen fluoride gas is supplied into the plasma processing chamber 10. In step ST23, steps ST1 to ST3 of the above-described method MT1 may be executed. The hydrogen fluoride molecule HF1 in the hydrogen fluoride gas reacts with the deposit DP, and as a result, the reaction product HF3 such as silicon fluoride may be produced. When the reaction product HF3 is volatilized, the deposit DP may be removed. In an embodiment, the second processing gas that includes hydrogen fluoride gas is supplied without generating plasma. In this case, the etching of the mask MS by plasma may be suppressed. As a result, the deformation of the mask MS may be suppressed.

In step ST24, the carbon-containing film AC is etched using plasma as in step ST22.

In step ST25, hydrogen fluoride is supplied to the mask MS so as to remove the deposit DP formed in step ST24, as in step ST23.

After step ST25, steps ST22 and ST23 may be repeated. As a result, the recess RS may be deepened.

According to the method MT3 described above, the deposit DP may be removed by hydrogen fluoride while suppressing the deformation of the mask MS in step ST23. Accordingly, in step ST24, the recess RS having a desired shape may be formed in the carbon-containing film AC. For example, as compared with a case where the deposit DP is removed by using plasma generated from a fluorine-containing gas instead of hydrogen fluoride, the shape defect (bowing) of the recess RS may be suppressed. This is believed to be because step ST24 may be executed in a state where the inclination of a shoulder portion of the mask MS is relatively small.

In an example, the recess RS having the desired shape has a side wall parallel to the thickness direction of the carbon-containing film AC. In another example, the recess RS having the desired shape has a side wall inclined to the thickness direction of the carbon-containing film AC. For example, the side wall of the recess RS has a tapered shape.

Figure 21:
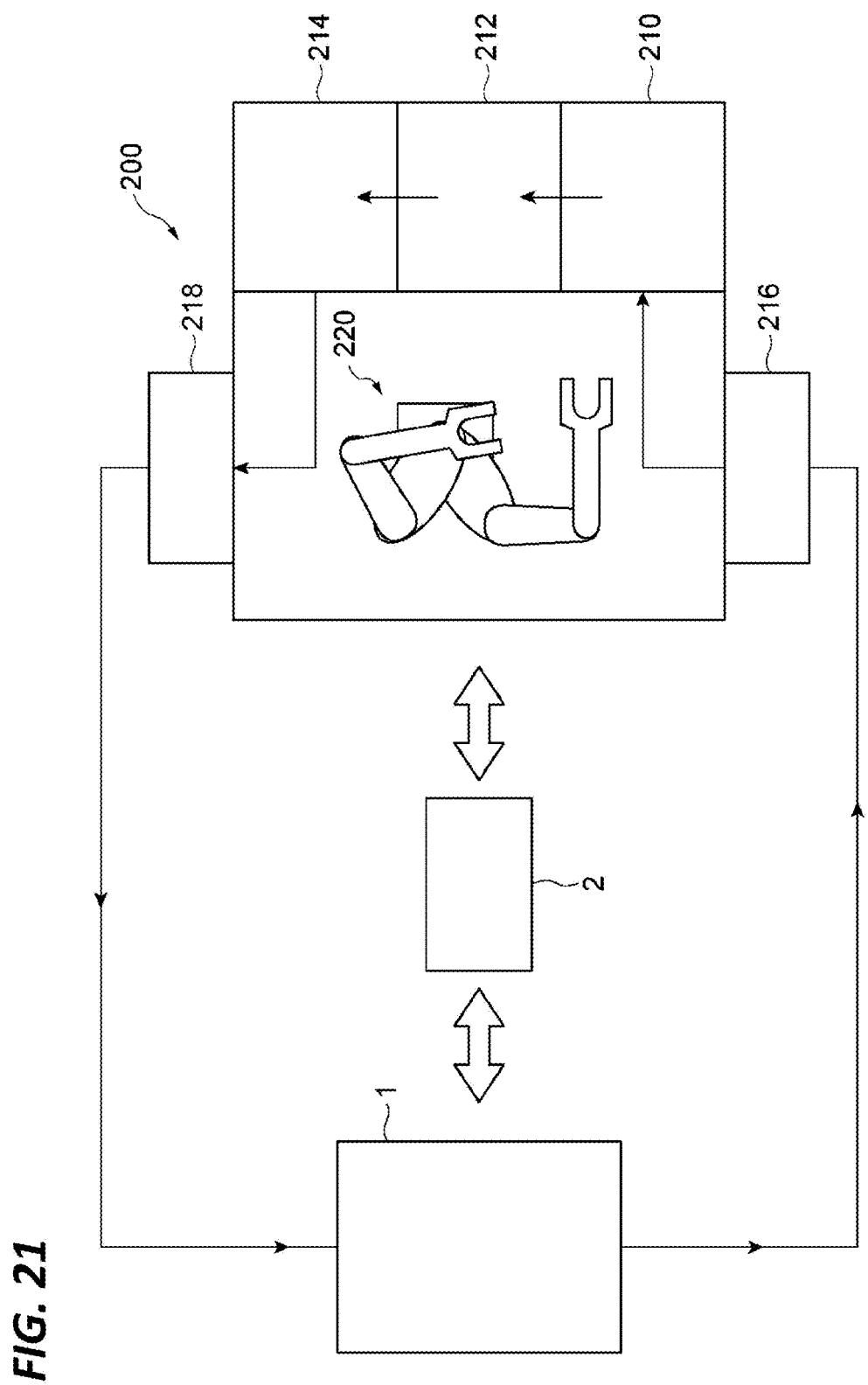
FIG. 21 is a view schematically illustrating a substrate processing apparatus according to an embodiment.

FIG. 21 is a view schematically illustrating a substrate processing apparatus according to an embodiment. The method MT3 may be applied to the substrate W1 by using the substrate processing apparatus illustrated in FIG. 21.

The substrate processing apparatus of FIG. 21 includes a plasma processing apparatus 1, a controller 2, and a wet processing apparatus 200. The substrate processing apparatus may include a transfer robot that transfers the substrate W1 between the plasma processing apparatus 1 and the wet processing apparatus 200. The controller 2 is configured to control each unit of the plasma processing apparatus 1 and the wet processing apparatus 200. The method MT3 may be executed in the substrate processing apparatus of FIG. 21 under the control by the controller 2.

The wet processing apparatus 200 may include a container 210 for accommodating hydrofluoric acid, a container 212 for accommodating a rinse liquid, and a container 214 for accommodating deionized water. The wet processing apparatus 200 may include a dryer for drying the substrate W1.

The wet processing apparatus 200 may include a carry-in port 216 for receiving the substrate W1 carried out from the plasma processing apparatus 1, a carry-out port 218 for carrying out the substrate W1 to the plasma processing apparatus 1, and a transfer robot 220 that transfers the substrate W1. The transfer robot 220 transfers the substrate W1 from the carry-in port 216 to the container 210. The transfer robot 220 transfers the substrate W1 from the container 210 to the container 212. The transfer robot 220 transfers the substrate W1 from the container 212 to the container 214. The transfer robot 220 transfers the substrate W1 from the container 214 to the carry-out port 218.

When the method MT3 is executed in the substrate processing apparatus of FIG. 21, steps ST21, ST22, and ST24 may be performed in the plasma processing apparatus 1. Steps ST23 and ST25 may be performed in the wet processing apparatus 200. In steps ST23 and ST25, hydrofluoric acid is supplied to the substrate W1. As a result, the deposit DP is removed by hydrofluoric acid. The substrate W1 may be immersed in the hydrofluoric acid of the container 210. Then, the substrate W1 may be immersed in the rinse liquid of the container 212. Then, the substrate W1 may be immersed in the deionized water of the container 214. Then, the substrate W1 may be dried in the dryer of the wet processing apparatus 200. Alternatively, the substrate W1 may be dried by the decompression in the plasma processing chamber 10 of the plasma processing apparatus 1.

Hereinafter, various experiments conducted for evaluating the method MT1 will be described. The experiments described below do not limit the present disclosure.

(Sixth Experiment)

In a sixth experiment, a substrate having an amorphous carbon film and a mask provided on the amorphous carbon film was prepared. The mask is a silicon oxynitride film. Then, steps ST21 to ST23 of the method MT3 described above were executed on the substrate. In step ST22, the amorphous carbon film was etched using plasma. In step ST23, the substrate was immersed in hydrofluoric acid. As a result, the deposit adhering to the opening of the mask by the etching was removed.

(Seventh Experiment)

In a seventh experiment, without performing step ST23 after step ST22, the deposit adhering to the opening of the mask was removed using plasma generated from a fluorine-containing gas, instead of hydrogen fluoride.

(Result)

Figure 22:
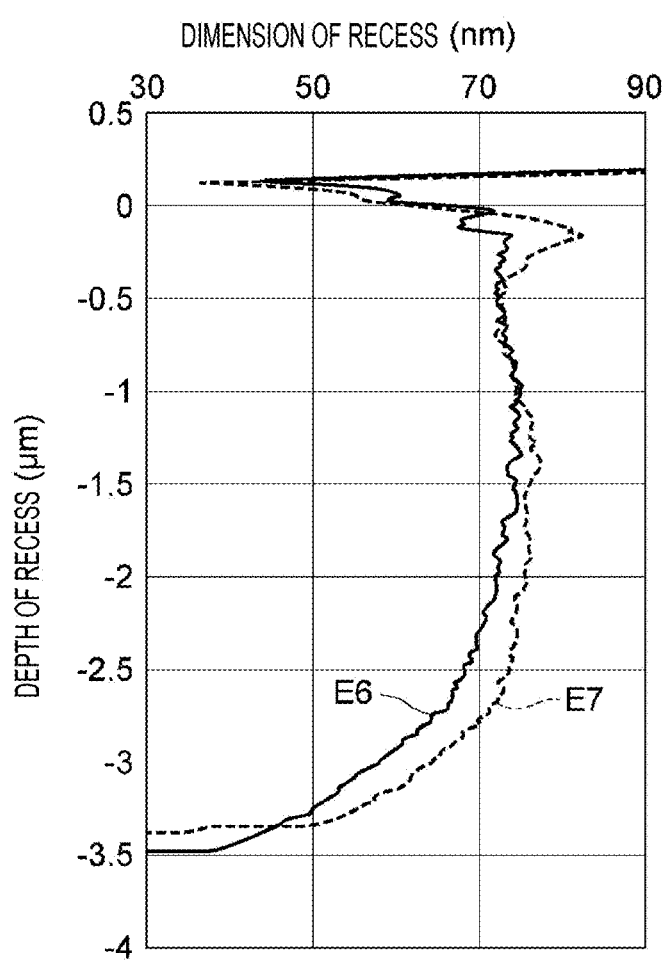
FIG. 22 is a graph representing an example of a relationship between a depth and a dimension of a recess.

The depth and the dimension of the recess formed in the amorphous carbon film were measured from the cross-sectional image of the substrate obtained in the sixth and seventh experiments. FIG. 22 represents the result.

FIG. 22 is a graph representing an example of a relationship between the depth and the dimension of the recess. The vertical axis represents the depth (μm) of the recess formed in the amorphous carbon film. The position where the value on the vertical axis is 0 μm is the boundary position between the amorphous carbon film and the mask. The horizontal axis represents the dimension (nm) of the recess formed in the amorphous carbon film. In the graph, E6 represents the result of the sixth experiment, and E7 represents the result of the seventh experiment. As illustrated in FIG. 22, the dimension of the recess in the sixth experiment is smaller than the dimension of the recess in the seventh experiment, in the depth range of −0.5 μm to 0 μm and the depth range of −3 μm to −1 μm. This indicates that the shape defect (bowing) of the recess is suppressed in the sixth experiment, as compared with the seventh experiment.

Figure 23:
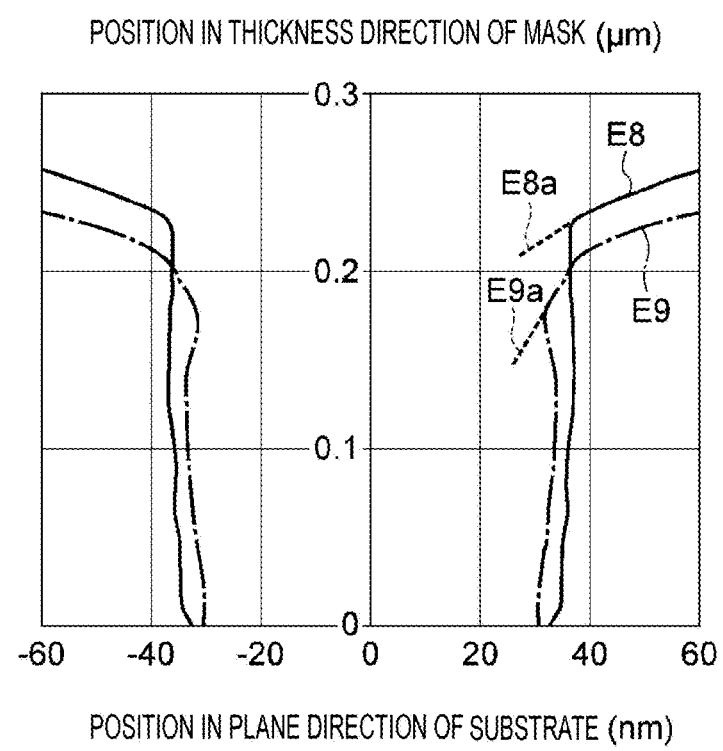
FIG. 23 is a graph representing an example of a position of an opening of a mask.

The position of the opening of the mask was measured from the cross-sectional image of the substrate obtained in the sixth and seventh experiments. FIG. 23 represents the result.

FIG. 23 is a graph representing an example of the position of the opening of the mask. The vertical axis represents the position (μm) in the thickness direction of the mask. The position where the value on the vertical axis is 0 μm is the boundary position between the amorphous carbon film and the mask. The horizontal axis represents the position (nm) in the plane direction of the substrate (the direction perpendicular to the thickness direction of the mask). The position where the value on the horizontal axis is 0 μm is the center position of the opening of the mask. In the graph, E8 represents the result of the sixth experiment, and E9 represents the result of the seventh experiment. As illustrated in FIG. 23, the thickness of the mask in the sixth experiment is larger than the thickness of the mask in the seventh experiment. This indicates that the etching of the mask is suppressed in the sixth experiment, as compared with the seventh experiment. Further, as illustrated in FIG. 23, the inclination E8a of the shoulder portion of the mask to the plane direction of the substrate W1 in the sixth experiment is smaller than the inclination E9a of the shoulder portion of the mask to the plane direction of the substrate W1 in the seventh experiment. This indicates that the shoulder portion of the mask is hardly deformed in the sixth experiment, as compared with the seventh experiment.

Figure 24:
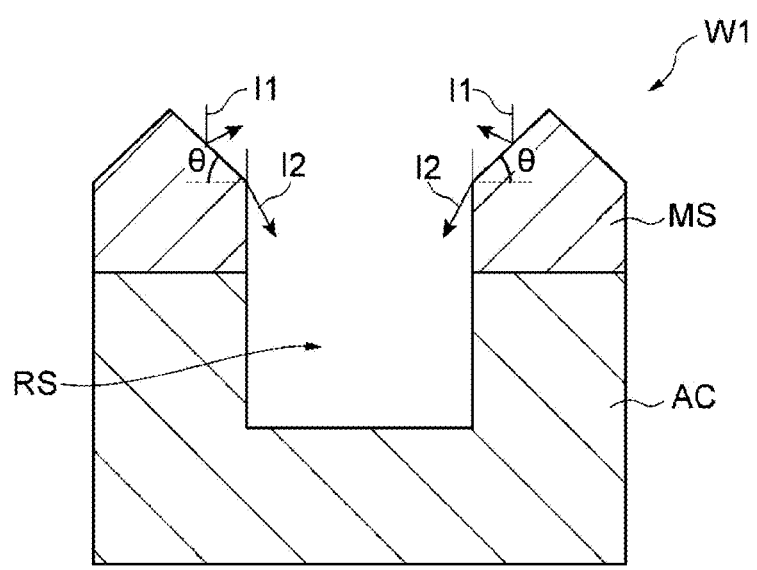
FIG. 24 is a partially enlarged cross-sectional view of an example of a substrate.

FIG. 24 is a partially enlarged cross-sectional view of an example of a substrate. As illustrated in FIG. 24, in the cross section of the substrate W1, the shoulder portion of the mask MS is inclined by an angle θ with respect to the plane direction of the substrate W1. When the angle θ is relatively small, ions I1 in plasma collide with the shoulder portion of the mask, and sputter the mask. Meanwhile, when the angle θ is relatively large, ions I2 in plasma may be reflected into the recess RS due to the shoulder portion of the mask. As a result, since the side wall of the recess RS is etched by the ions I2, the shape defect (bowing) of the recess may easily occur.

While various embodiments have been described, various additions, omissions, substitutions, and changes may be made without being limited to the embodiments. Further, components in different embodiments may be combined with each other to form another embodiment.

For example, the substrate processing apparatus may not include the plasma generator 12. In this case, the plasma processing is not performed in the chamber of the substrate processing apparatus. The methods MT1 and MT2 may be performed by using the substrate processing apparatus.

According to an embodiment, it is possible to provide a substrate processing method, a component processing method, and a substrate processing apparatus, which are capable of removing a substance present on the surface of a substrate or a component.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   (a) disposing a substrate on a substrate support provided in a chamber of a substrate processing apparatus;
   (b) supplying a processing gas including hydrogen fluoride gas into the chamber;
   (c) controlling a temperature of the substrate support to a first temperature, and a pressure of the hydrogen fluoride gas in the chamber to a first pressure; and
   (d) controlling the temperature of the substrate support to a second temperature, and the pressure of the hydrogen fluoride gas in the chamber to a second pressure,
   wherein in a graph with a horizontal axis indicating a temperature and a vertical axis indicating a pressure, the first temperature and the first pressure are positioned in a first region above an adsorption equilibrium pressure curve of hydrogen fluoride, and the second temperature and the second pressure are positioned in a second region below the adsorption equilibrium pressure curve, and
   wherein the first temperature and the second temperature are in a range of −140° C. or higher and 0° C. or lower, and the first pressure and the second pressure are in a range of 1 Pa or more and $1\times10^5$ Pa or less.

2. The substrate processing method according to claim 1, wherein in the graph, the first region is positioned below a saturated vapor pressure curve of hydrogen fluoride.

3. The substrate processing method according to claim 1, wherein the substrate includes a silicon-containing film.

4. The substrate processing method according to claim 1, wherein the substrate includes a metal-containing film.

5. The substrate processing method according to claim 1, wherein in (c), a substance produced from the substrate processing apparatus adheres to a surface of the substrate.

6. The substrate processing method according to claim 1, wherein the processing gas includes an inert gas.

7. A substrate processing apparatus comprising:
   a chamber;
   a substrate support configured to support a substrate in the chamber;
   a gas supply configured to supply a processing gas including hydrogen fluoride gas into the chamber; and
   a controller configured to control an overall operation of the substrate processing apparatus,
   wherein the controller is configured to:
     control a temperature of the substrate support to a first temperature, and a pressure of the hydrogen fluoride gas in the chamber to a first pressure; and
     control the temperature of the substrate support to a second temperature, and the pressure of the hydrogen fluoride gas in the chamber to a second pressure,
   wherein in a graph with a horizontal axis indicating a temperature and a vertical axis indicating a pressure, the first temperature and the first pressure are positioned in a first region above an adsorption equilibrium pressure curve of hydrogen fluoride, and the second temperature and the second pressure are positioned in a second region below the adsorption equilibrium pressure curve, and
   wherein the first temperature and the second temperature are in a range of −140° C. or higher and 0° C. or lower, and the first pressure and the second pressure are in a range of 1 Pa or more and $1\times10^5$ Pa or less.

8. A substrate processing method comprising:
   (a) providing a substrate on a substrate support, the substrate including a first film and a second film provided on the first film, the second film having an opening therein;
   (b) etching the first film using plasma;
   (c) supplying a processing gas including hydrogen fluoride to the substrate, thereby removing a deposit adhering to the opening of the second film in (b);
   wherein (c) includes:
   (c-1) controlling a temperature of the substrate support to a first temperature, and a pressure of the hydrogen fluoride gas in the chamber to a first pressure; and
   (c-2) controlling the temperature of the substrate support to a second temperature, and the pressure of the hydrogen fluoride gas in the chamber to a second pressure,
   wherein in a graph with a horizontal axis indicating a temperature and a vertical axis indicating a pressure, the first temperature and the first pressure are positioned in a first region above an adsorption equilibrium pressure curve of hydrogen fluoride, and the second temperature and the second pressure are positioned in a second region below the adsorption equilibrium pressure curve, and
   wherein the first temperature and the second temperature are in a range of −140° C. or higher and 0° C. or lower, and the first pressure and the second pressure are in a range of 1 Pa or more and $1\times10^5$ Pa or less.

9. The substrate processing method according to claim 8, wherein in (c), hydrogen fluoride gas is supplied without generating plasma.

10. The substrate processing method according to claim 8, wherein in (c), hydrofluoric acid is supplied.

11. The substrate processing method according to claim 8, further comprising:
    (d) after (c), etching the first film using plasma.

12. The substrate processing method according to claim 11, further comprising:
    (e) after (d), supplying hydrogen fluoride to the substrate, thereby removing the deposit adhering to the opening of the second film in (d).

13. The substrate processing method according to claim 8, wherein the second film contains silicon.

14. The substrate processing method according to claim 8, wherein the first film contains carbon.

15. The substrate processing method according to claim 8, wherein the second film is a mask.

16. The substrate processing method according to claim 8, further comprising:
    (f) repeating (b) and (c).

17. The substrate processing method according to claim 8, wherein the first film is selected from the group consisting of a polycrystalline silicon film, an amorphous silicon film, and a SiGe film.

* * * * *